United States Patent
Yorimoto et al.

(10) Patent No.: US 9,716,124 B2
(45) Date of Patent: Jul. 25, 2017

(54) IMAGE CAPTURING APPARATUS, MEDIUM TYPE DETERMINING APPARATUS, AND IMAGE FORMING APPARATUS

(71) Applicants: Mamoru Yorimoto, Kanagawa (JP); Nobuyuki Satoh, Kanagawa (JP); Masato Kobayashi, Kanagawa (JP); Masayuki Fujii, Kanagawa (JP); Hiroshi Matsumoto, Kanagawa (JP); Daisaku Horikawa, Kanagawa (JP); Suguru Yokozawa, Kanagawa (JP); Kenji Morita, Tokyo (JP)

(72) Inventors: Mamoru Yorimoto, Kanagawa (JP); Nobuyuki Satoh, Kanagawa (JP); Masato Kobayashi, Kanagawa (JP); Masayuki Fujii, Kanagawa (JP); Hiroshi Matsumoto, Kanagawa (JP); Daisaku Horikawa, Kanagawa (JP); Suguru Yokozawa, Kanagawa (JP); Kenji Morita, Tokyo (JP)

(73) Assignee: RICOH COMPANY, LTD., Tokyo (JP)

( * ) Notice: Subject to any disclaimer, the term of this patent is extended or adjusted under 35 U.S.C. 154(b) by 420 days.

(21) Appl. No.: 14/563,741

(22) Filed: Dec. 8, 2014

(65) Prior Publication Data
US 2015/0162372 A1 Jun. 11, 2015

(30) Foreign Application Priority Data

Dec. 9, 2013 (JP) .................................. 2013-254501
Nov. 26, 2014 (JP) .................................. 2014-239198

(51) Int. Cl.
*H01L 27/146* (2006.01)
*H04N 1/60* (2006.01)

(52) U.S. Cl.
CPC ...... *H01L 27/14643* (2013.01); *H04N 1/6044* (2013.01)

(58) Field of Classification Search
CPC ............ H01L 27/146; H01L 27/14643; H04N 1/6044
(Continued)

(56) References Cited

U.S. PATENT DOCUMENTS 4,945,253 A * 7/1990 Frohardt ................ G01N 21/57
250/559.16
5,153,668 A * 10/1992 Katzir ................ G01N 21/8806
356/237.2
(Continued)

FOREIGN PATENT DOCUMENTS

| JP | 2012-063270 | 3/2012 |
|---|---|---|
| JP | 2012-194445 | 10/2012 |
| JP | 2013-051671 | 3/2013 |

*Primary Examiner* — Seung C Sohn
(74) *Attorney, Agent, or Firm* — Duft Bornsen & Fettig LLP

(57) ABSTRACT

An apparatus includes: a light source; a two-dimensional image sensor that receives reflected light from a subject including specular light of the source and outputs an image of the subject; and an optical member arranged in an optical path of light emitted from the source to the subject. When a specular position of the source in the subject arranged apart from the two-dimensional image sensor by a certain distance is defined as a first specular position, whereas a specular position of the source in the optical member is defined as a second specular position, a relative positional relation of the optical member and the source with respect to the two-dimensional image sensor is determined so that a difference between an incident angle from the source toward the first specular position and an incident angle from the source toward the second specular position is a reference value or more.

6 Claims, 18 Drawing Sheets

(58) Field of Classification Search
USPC .................................................. 250/208.1
See application file for complete search history.

(56) References Cited

U.S. PATENT DOCUMENTS

| | | | |
|---|---|---|---|
| 8,678,540 B2 | 3/2014 | Satoh et al. | |
| 2006/0256341 A1* | 11/2006 | Kuwada | G01N 21/57 356/445 |
| 2012/0069411 A1 | 3/2012 | Satoh et al. | |
| 2012/0236308 A1 | 9/2012 | Satoh | |
| 2013/0027720 A1 | 1/2013 | Satoh | |
| 2013/0027721 A1 | 1/2013 | Kobayashi et al. | |
| 2013/0135484 A1 | 5/2013 | Satoh et al. | |
| 2013/0208289 A1 | 8/2013 | Satoh et al. | |
| 2013/0229671 A1 | 9/2013 | Yokozawa et al. | |
| 2013/0242319 A1 | 9/2013 | Suzuki et al. | |
| 2013/0242320 A1 | 9/2013 | Suzuki et al. | |
| 2013/0242321 A1 | 9/2013 | Okada et al. | |
| 2013/0242361 A1 | 9/2013 | Matsumoto et al. | |
| 2013/0258368 A1 | 10/2013 | Shigemoto et al. | |
| 2013/0258369 A1 | 10/2013 | Suzuki et al. | |

* cited by examiner

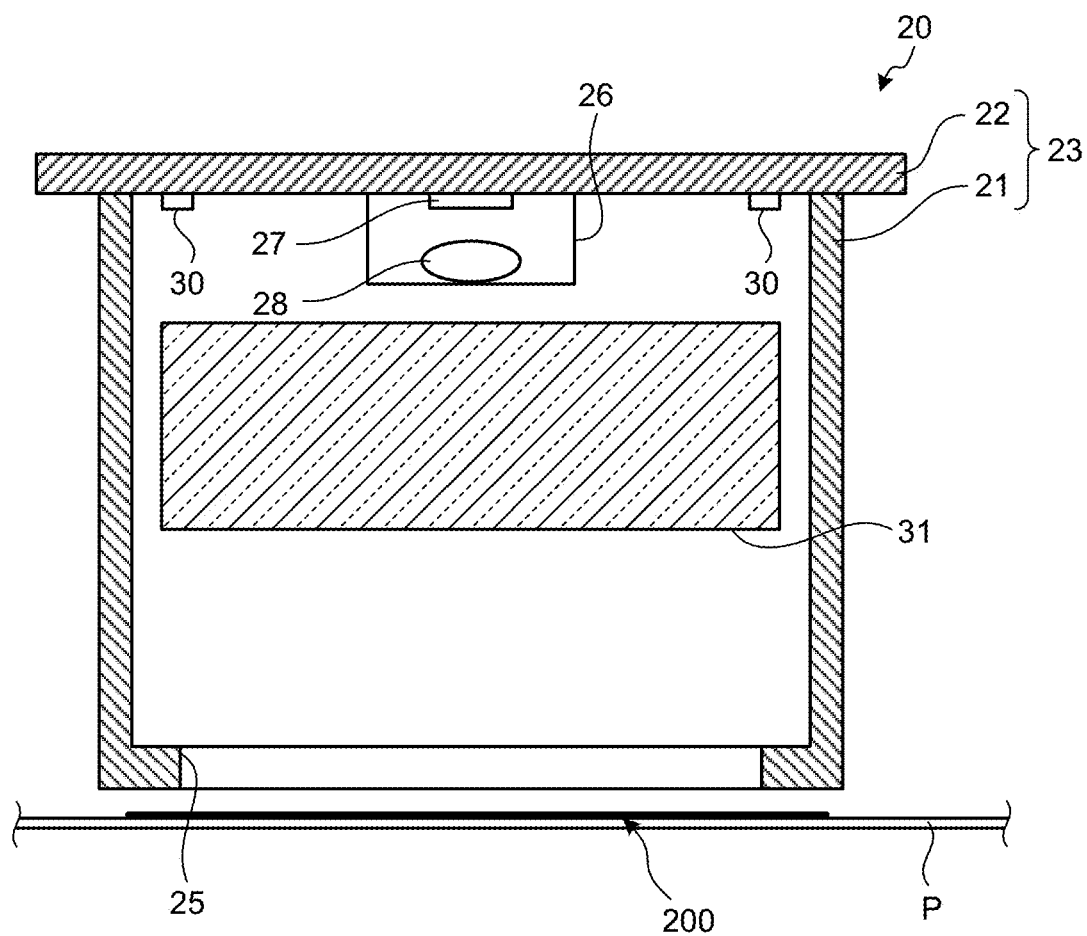

| PATCH NO. | Rd | Gd | Bd | Ld | ad | bd | | Xd | Yd | Zd |
|---|---|---|---|---|---|---|---|---|---|---|
| 1 | 3 | 8 | 5 | 6 | 7 | 2 | | | | |
| 2 | | | | | | | | | | |
| 3 | | | | | | | | | | |
| ... | | | | | | | | | | |
| ... | | | | | | | | | | |
| | | | | | | | | | | |
| ... | | | | | | | | | | |
| 72 | | | | | | | | | | |

INITIAL REFERENCE RGB VALUES (RdGdBd)

Tb1

IMAGE CAPTURING APPARATUS, MEDIUM TYPE DETERMINING APPARATUS, AND IMAGE FORMING APPARATUS

CROSS-REFERENCE TO RELATED APPLICATIONS

The present application claims priority to and incorporates by reference the entire contents of Japanese Patent Application No. 2013-254501 filed in Japan on Dec. 9, 2013 and Japanese Patent Application No. 2014-239198 filed in Japan on Nov. 26, 2014.

BACKGROUND OF THE INVENTION

1. Field of the Invention

The present invention relates to an image capturing apparatus, a medium type determining apparatus, and an image forming apparatus.

2. Description of the Related Art

Image capturing apparatuses are known that capture an image of patches printed on a print medium by a two dimensional image sensor and convert obtained RGB values of the patches into color specification values in a standard color space, thereby performing the colorimetry of the patches (refer to Japanese Laid-open Patent Publication No. 2012-63270, for example). The image capturing apparatus disclosed in Japanese Laid-open Patent Publication No. 2012-63270 is mounted on a carriage of an image forming apparatus, captures the image of patches printed on a print medium by the image forming apparatus to acquire RGB values, and calculates colorimetric values of the patches by using the RGB values. The colorimetric values of the patches calculated by the image capturing apparatus are used for color adjustment of the image forming apparatus. The color adjustment of the image forming apparatus may be performed by using the RGB values that the image capturing apparatus has obtained from the patches.

Meanwhile, the function to determine the type of print media on which images are printed is a function required for image forming apparatuses. For example, Japanese Laid-open Patent Publication No. 2012-194445 discloses an image forming apparatus having an optical sensor that determines the type of a print medium based on the intensity of specular light from the print medium.

For example, a configuration that receives specular light from a print medium using the two-dimensional image sensor included in the image capturing apparatus disclosed in Japanese Laid-open Patent Publication No. 2012-63270 can achieve a convenient image capturing apparatus that has both the function to perform the colorimetry of patches or the acquisition of RGB values for the color adjustment of the image forming apparatus and the function to determine the type of print media.

However, the image capturing apparatus disclosed in Japanese Laid-open Patent Publication No. 2012-63270 includes a transmission member that transmits light in a casing, and when specular light from a print medium is received by the two-dimensional sensor, it is expected that specular light from the bottom face of the transmission member also enters the two-dimensional sensor. If the optical images of these pieces of specular light overlap one another on a light-receiving face of the two-dimensional sensor, a problem arises in that the specular light from the print medium cannot be accurately detected.

In view of the above circumstances, there is a need to provide an image capturing apparatus, a medium type determining apparatus, and an image forming apparatus that can accurately detect specular light from a subject.

SUMMARY OF THE INVENTION

It is an object of the present invention to at least partially solve the problems in the conventional technology.

An image capturing apparatus includes: a light source; a two-dimensional image sensor that receives reflected light from a subject including specular light of the light source and outputs an image of the subject; and an optical member arranged in an optical path of light emitted from the light source to the subject. When a specular position of the light source in the subject arranged apart from the two-dimensional image sensor by a certain distance is defined as a first specular position, whereas a specular position of the light source in the optical member is defined as a second specular position, a relative positional relation of the optical member and the light source with respect to the two-dimensional image sensor is determined so that a difference between an incident angle from the light source toward the first specular position and an incident angle from the light source toward the second specular position is a reference value or more. The reference value is a value with which an optical image of the first specular position and an optical image of the second specular position do not overlap each other on a light-receiving face of the two-dimensional image sensor.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 1 is a perspective view showing an image forming apparatus such that the inside thereof is seen through;

FIG. 4B is a vertical sectional view (a sectional view along the X2-X2 line in FIG. 4C) of the colorimetric camera;

DETAILED DESCRIPTION OF THE PREFERRED EMBODIMENTS

The following describes embodiments of an image capturing apparatus, a medium type determining unit, and an image forming apparatus according to the present invention in detail with reference to the attached drawings. Although the following embodiments exemplify an inkjet printer as an example of the image forming apparatus to which the present invention is applied, the present invention can be widely applied to various types of image forming apparatuses that print images on print media.

Mechanical Configuration of Image Forming Apparatus

Figure 1:
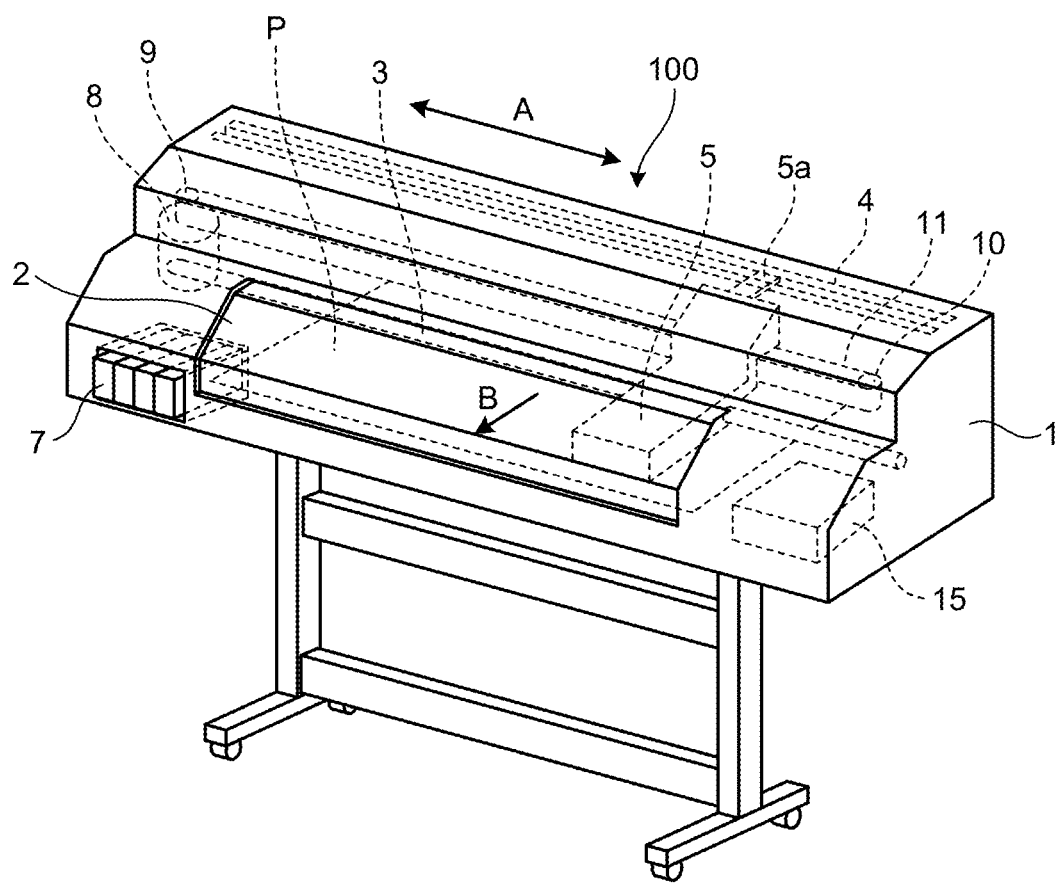

First, the mechanical configuration of an image forming apparatus 100 according to the present embodiment will be described with reference to FIG. 1 to FIG. 3. FIG. 1 is a perspective view showing the image forming apparatus 100 such that the inside thereof is seen through, FIG. 2 is a top view illustrating the mechanical configuration of the inside of the image forming apparatus 100, and FIG. 3 is a diagram illustrating an arrangement example of a recording head 6 installed in a carriage 5.

As illustrated in FIG. 1, the image forming apparatus 100 according to the present embodiment includes the carriage (a support) 5 that reciprocates in a main-scanning direction (the arrow A direction in the drawing). The carriage 5 is supported by a main guide rod 3 extending in the main-scanning direction. The carriage 5 includes a connecting piece 5a. The connecting piece 5a is engaged with a sub guide member 4 provided parallel to the main guide rod 3 and stabilizes the attitude of the carriage 5.

Figure 2:
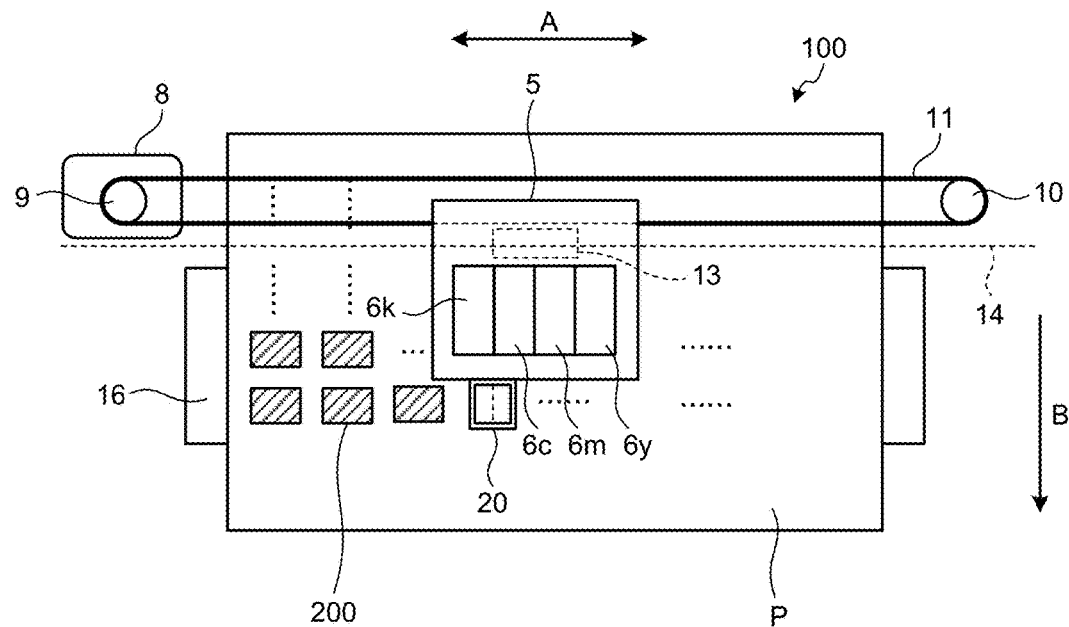
FIG. 2 is a top view illustrating the mechanical configuration of the inside of the image forming apparatus.
Figure 3:
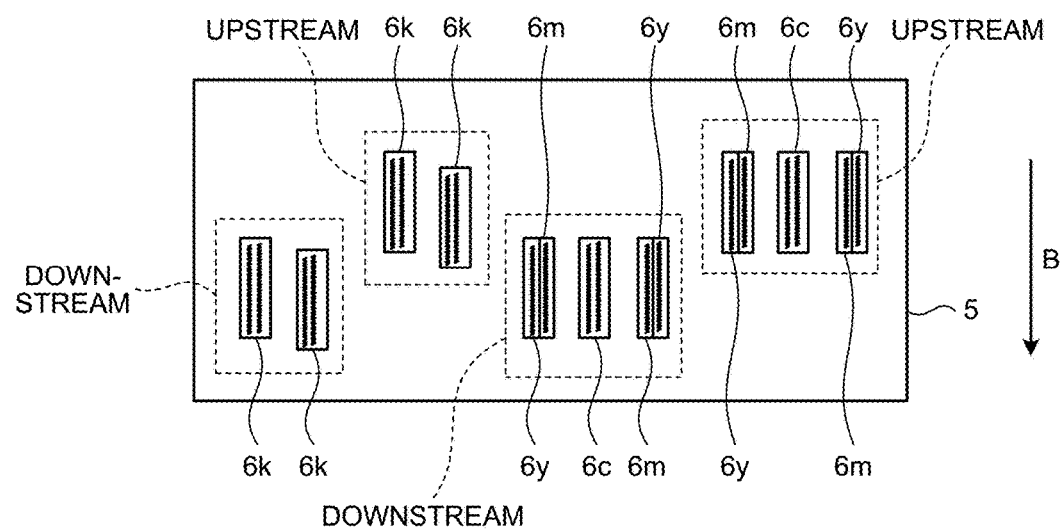
FIG. 3 is a diagram illustrating an arrangement example of a recording head installed in a carriage.

As illustrated in FIG. 2, four recording heads 6y, 6m, 6c, and 6k are installed in the carriage 5. The recording head 6y is a recording head that discharges yellow (Y) ink. The recording head 6m is a recording head that discharges magenta (M) ink. The recording head 6c is a recording head that discharges cyan (C) ink. The recording head 6k is a plurality of recording heads that discharge black (Bk) ink. When these recording heads 6y, 6m, 6c, and 6k are collectively referred to in the following, they are referred to as a recording head 6. The recording head 6 is supported by the carriage 5 so that its discharge face (nozzle face) is directed downward (toward a print medium P).

A cartridge 7 as an ink supplier for supplying ink to the recording head 6 is not installed in the carriage 5 but is arranged at a certain position within the image forming apparatus 100. The cartridge 7 and the recording head 6 are connected through a pipe (not illustrated), and the ink is supplied from the cartridge 7 to the recording head 6 through the pipe.

The carriage 5 is coupled to a timing belt 11 stretched between a drive pulley 9 and a driven pulley 10. The drive pulley 9 rotates by the drive of a main-scanning motor 8. The driven pulley 10 has a mechanism to adjust the distance to the drive pulley 9 and has a role of giving certain tension to the timing belt 11. The carriage 5 reciprocates in the main-scanning direction through the feeding operation of the timing belt 11 by the drive of the main-scanning motor 8. As illustrated in FIG. 2, for example, the movement of the carriage 5 in the main-scanning direction is controlled based on an encoder value obtained by the detection of a mark of an encoder sheet 14 by an encoder sensor 13 provided in the carriage 5.

The image forming apparatus 100 according to the present embodiment includes a maintenance mechanism 15 for maintaining the reliability of the recording head 6. The maintenance mechanism 15 performs the cleaning and capping of the recording head 6, the discharge of unnecessary ink from the recording head 6, and/or the like.

As illustrated in FIG. 2, a platen 16 is arranged at a position facing the discharge face of the recording head 6. The platen 16 supports the print medium P when the recording head 6 discharges ink onto the print medium P. The image forming apparatus 100 according to the present embodiment is a wide format machine that travels in the main-scanning direction of the carriage 5 for a long distance. For this reason, the platen 16 is formed by connecting a plurality of plate members in the main-scanning direction (the travel direction of the carriage 5). The print medium P is held between conveying rollers that are driven by a sub-scanning motor (not illustrated) and is intermittently conveyed in a sub-scanning direction on the platen 16.

The recording head 6 includes a plurality of nozzle arrays, and the nozzle arrays discharge ink onto the print medium P conveyed on the platen 16, thereby printing an image on the print medium P. In the present embodiment, in order to ensure that the width of an image that can be printed by one scanning of the carriage 5 is large, as illustrated in FIG. 3, upstream recording heads 6 and downstream recording heads 6 are installed in the carriage 5. The number of the recording heads 6k that discharge black ink installed in the carriage 5 is twice as many as the numbers of the recording heads 6y, 6m, and 6c that discharge color ink. The recording heads 6y and 6m are arranged laterally separated from each other. This arrangement is intended to match a color overlapping order in the reciprocating operation of the carriage 5 to prevent color from being different between the forward scanning and the backward scanning. The arrangement of the recording head 6 illustrated in FIG. 3 is an example, and it is not limited to the arrangement illustrated in FIG. 3.

The components constituting the image forming apparatus 100 according to the present embodiment are arranged within an exterior body 1. The exterior body 1 includes a cover member 2 in an openable/closable manner. During the maintenance of the image forming apparatus 100 or at the time of occurrence of paper jam, the cover member 2 is opened, and then work on the components arranged within the exterior body 1 can be performed.

The image forming apparatus 100 according to the present embodiment intermittently conveys the print medium P in the sub-scanning direction (the arrow B direction in the drawing), and while the conveyance of the print medium P in the sub-scanning direction is stopped, discharges ink from the nozzle arrays of the recording head 6 installed in the carriage 5 onto the print medium P on the platen 16, while moving the carriage 5 in the main-scanning direction, thereby printing an image on the print medium P.

At the time of color adjustment that performs color adjustment of the image forming apparatus 100 in particular, ink is discharged from the nozzle arrays of the recording head 6 installed in the carriage 5 onto the print medium P on the platen 16, thereby printing a test pattern in which many patches 200 are arranged. Colorimetry is performed on the respective patches 200 contained in the test pattern. The respective patches 200 contained in the test pattern are images obtained by printing reference color patterns using actual ink by the image forming apparatus 100 and reflect characteristics unique to the image forming apparatus 100. Thus, using colorimetric values of these patches 200, a device profile that describes the characteristics unique to the image forming apparatus 100 can be generated or modified. Performing color transformation between a standard color space and device-dependent color based on the device profile enables the image forming apparatus 100 to output a highly reproducible image.

The image forming apparatus 100 according to the present embodiment includes a colorimetric camera (an image capturing apparatus) 20 for performing the colorimetry of the respective patches 200 contained in the test pattern printed on the print medium P. As illustrated in FIG. 2, the colorimetric camera 20 is supported by the carriage 5 in which the recording head 6 is installed. The colorimetric camera 20 performs image capturing when it moves over the print medium P on which the test pattern is printed through the conveyance of the print medium P and the movement of the carriage 5 and reaches positions facing the respective patches 200. Based on RGB values of the patches 200 obtained by the image capturing, the colorimetric values of the patches 200 are calculated. In the present embodiment, an example will be described in which the color adjustment of the image forming apparatus 100 is performed by using the colorimetric values of the patches 200 that are calculated from the RGB values of the patches 200 obtained by the image capturing; however, it is also possible to perform the color adjustment of the image forming apparatus 100 by using the RGB values of the patches 200 obtained by the image capturing. In this case, the amount of ink discharged on the print medium P is adjusted by the color adjustment.

The image forming apparatus 100 according to the present embodiment determines the type of the print medium P to be used in printing using the colorimetric camera 20. For example, the colorimetric camera 20 has a function (a medium type determining apparatus) that, before performing the colorimetry of the respective patches 200 contained in the test pattern, performs image capturing of a margin of the print medium P, in which no patch 200 is formed, as a subject, and based on the obtained image, determines the type of the print medium P. When determining the type of the print medium P, the margin of the print medium P as the subject is irradiated with light from a medium type determining light source described below. The medium type determining light source is arranged so that specular light from the subject enters a two-dimensional image sensor described later. The colorimetric camera 20 receives the specular light from the subject by the two-dimensional image sensor and determines the type of the print medium P based on the intensity of the specular light, for example.

Specific Example of Colorimetric Camera

Figure 4A:
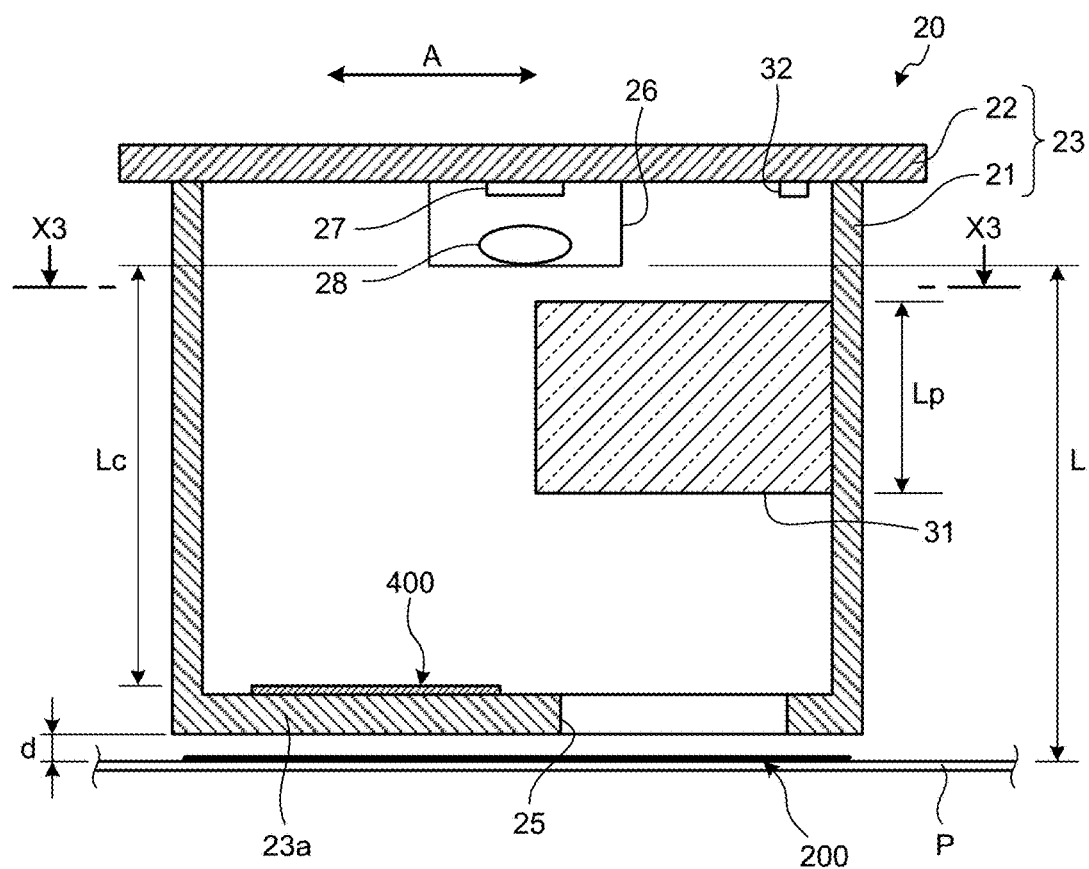
FIG. 4A is a vertical sectional view (a sectional view along the X1-X1 line in FIG. 4C) of a colorimetric camera.
Figure 4C:
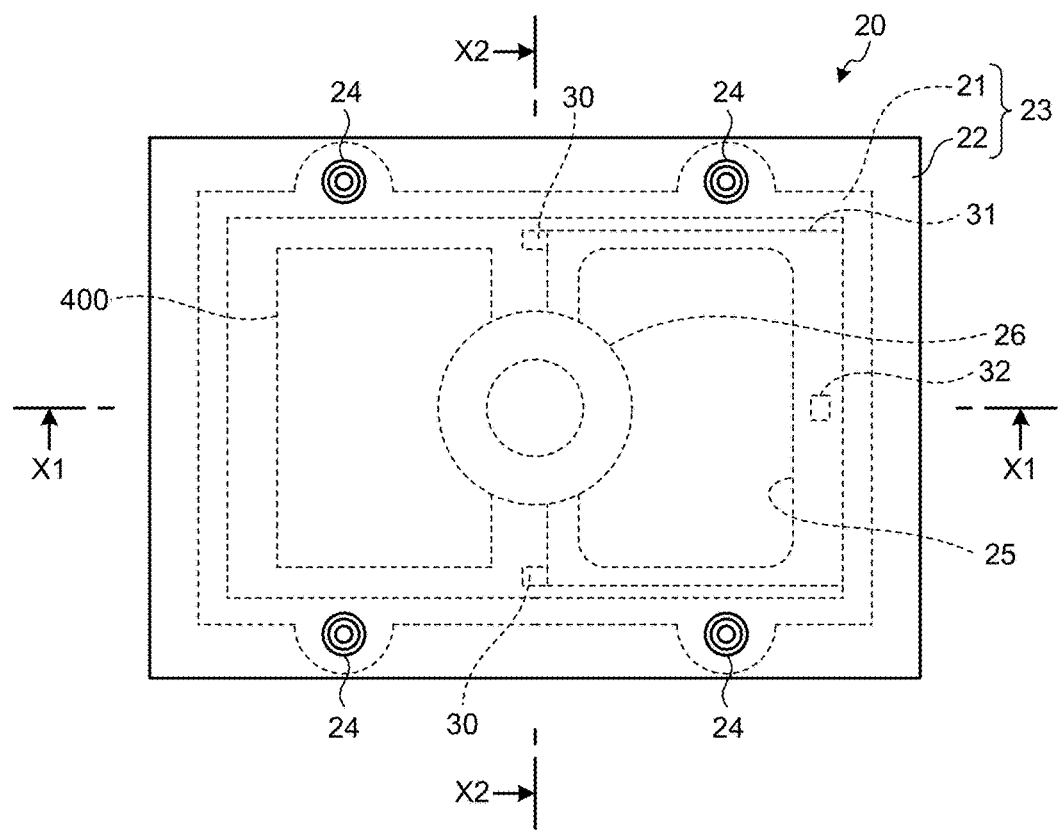
FIG. 4C is a top view showing the colorimetric camera such that the inside thereof is seen though.
Figure 4D:
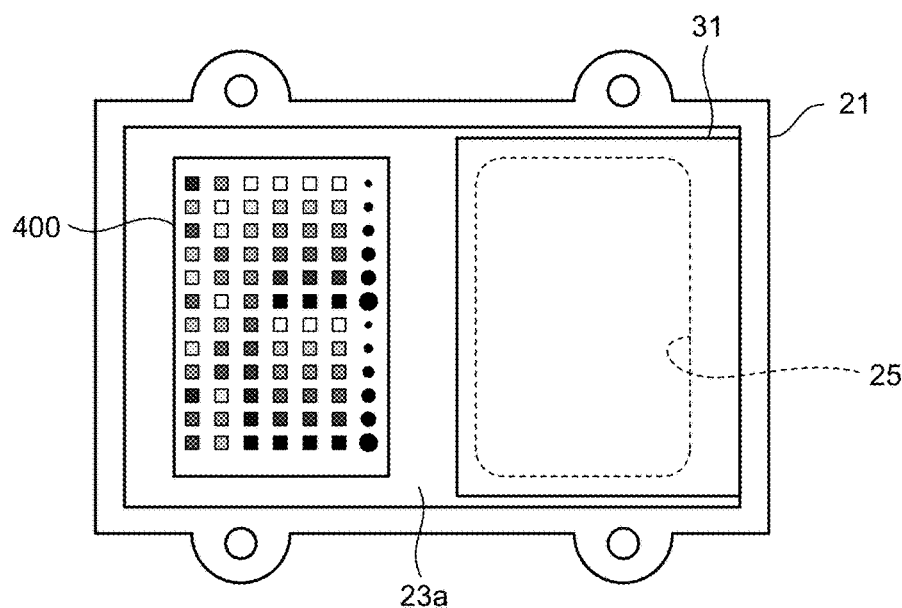
FIG. 4D is a plan view of the bottom face of a casing from the X3 direction in FIG. 4A.

Next, a specific example of the colorimetric camera 20 will be described in detail with reference to FIG. 4A to FIG. 4D. FIG. 4A to FIG. 4D are diagrams illustrating an example of the mechanical configuration of the colorimetric camera 20: FIG. 4A is a vertical sectional view (a sectional view along the X1-X1 line in FIG. 4C) of the colorimetric camera 20; FIG. 4B is a vertical sectional view (a sectional view along the X2-X2 line in FIG. 4C) of the colorimetric camera 20; FIG. 4C is a top view showing the colorimetric camera 20 such that the inside of thereof is seen through; and FIG. 4D is a plan view of the bottom face of a casing from the X3 direction in FIG. 4A.

The colorimetric camera 20 includes a casing 23 formed by combining a frame body 21 and a substrate 22. The frame body 21 is formed in a bottomed cylindrical shape having open one end being the upper face of the casing 23. The substrate 22 is fastened to the frame body 21 with a fastening member 24 to be integrated with the frame body 21 so as to close the open end of the frame body 21 and form the upper face of the casing 23.

The casing 23 is fixed to the carriage 5 so that its bottom face 23a faces the print medium P on the platen 16 with a certain gap d therebetween. The bottom face 23a of the casing 23 facing the print medium P has an opening 25 for enabling the photographing of a subject (the patch 200 at the time of color adjustment or the margin of the print medium P in determination of the type of the print medium P) from the inside of the casing 23.

The casing 23 includes a sensor unit 26 that performs image capturing. The sensor unit 26 includes a two-dimensional image sensor 27 such as a CCD sensor or a CMOS sensor and an imaging forming lens 28 that forms an optical image of an image capturing object area of the sensor unit 26 onto a light-receiving face of the two-dimensional image sensor 27. The two-dimensional image sensor 27 is mounted on, for example, the inner face (component mounting face) of the substrate 22 so that the light-receiving face faces the bottom face 23a of the casing 23. The imaging forming lens 28 is fixed so as to be positioned with respect to the two-dimensional image sensor 27 with a positional relation determined and maintained in accordance with its optical characteristics.

A reference chart 400 is arranged on the inner face of the bottom face 23a of the casing 23 facing the sensor unit 26 so as to be adjacent to the opening 25 formed on the bottom face 23a. An image of the reference chart 400 is captured together with an image of a patch 200 contained in the test pattern by the sensor unit 26 when colorimetry is performed on the patch 200. The reference chart 400 is arranged on the bottom face 23a of the casing 23 so as to be contained in the image capturing object area of the sensor unit 26 when the image of the patch 200 as a colorimetric object positioned outside the casing 23 is captured. The reference chart 400 will be described in detail later.

The casing 23 includes a colorimetric light source 30 for irradiating the image capturing object area of the sensor unit 26 with light when performing the colorimetry of the patch 200. Examples of the colorimetric light source 30 include a light emitting diode (LED). The colorimetric light source 30 is mounted on the inner face of the substrate 22, for example. The colorimetric light source 30 is only required to be arranged at a position that can irradiate the image capturing object area of the sensor unit 26 with light substantially uniformly and is not necessarily directly mounted on the substrate 22. Although the present embodiment uses an LED as the colorimetric light source 30, the type of the light source is not limited to the LED. The colorimetric light source 30 may be an organic EL, for example. When the organic EL is used as the colorimetric light source 30, irradiation light having a spectroscopic distribution close to that of sunlight can be obtained, and improvement in colorimetric accuracy can be expected.

In order to irradiate the patch 200 outside the casing 23 with light on the same irradiation conditions as the reference chart 400 arranged within the casing 23, it is necessary that the patch 200 be irradiated only with the irradiation light from the colorimetric light source 30 by preventing the patch 200 from being irradiated with external light. In order to prevent the patch 200 from being irradiated with the external light, it is effective to reduce the gap d between the bottom face 23a of the casing 23 and the print medium P, thereby blocking the external light directed toward the patch 200. However, if the gap d between the bottom face 23a of the casing 23 and the print medium P is reduced excessively, the print medium P may come into contact with the bottom face 23a of the casing 23, which may make it impossible to appropriately perform image capturing. Thus, considering the planarity of the print medium P, the gap d between the bottom face 23a of the casing 23 and the print medium. P is preferably set to a small value to the extent that the print medium P does not come into contact with the bottom face 23a of the casing 23. If the gap d between the bottom face 23a of the casing 23 and the print medium P is set at about 1 mm to 2 mm, for example, the print medium P does not come into contact with the bottom face 23a of the casing 23, and the patch 200 formed on the print medium P is effectively prevented from being irradiated with external light.

An optical path length changing member 31 (an optical member) is arranged inside the casing 23. The optical path length changing member 31 is an optical element having a refractive index n (n is any desired number) having a sufficient transmittance to the irradiation light. The optical path length changing member 31 is arranged in an optical path between the patch 200 outside the casing 23 and the sensor unit 26 and has the function to bring an imaging plane of an optical image of the patch 200 close to an imaging plane of an optical image of the reference chart 400. In other words, the colorimetric camera 20 according to the present embodiment arranges the optical path length changing member 31 in the optical path between the patch 200 and the sensor unit 26, thereby aligning both the imaging plane of the optical image of the patch 200 outside the casing 23 and the imaging plane of the reference chart 400 inside the casing 23 with the light-receiving face of the two-dimensional image sensor 27 of the sensor unit 26.

The optical path length changing member 31 is fixed to a certain position within the casing 23 by, for example, bonding its one side face to a side face of the frame body 21 or by being supported by a support member (not illustrated).

When light passes through the optical path length changing member 31, the optical path length extends in accordance with the refractive index n of the optical path length changing member 31, by which an image appears in a floated manner. A floating amount C of the image can be determined by the following formula:

$$C=Lp(1-1/n)$$

where Lp is the length of the optical path length changing member 31 in the optical axial direction.

The distance L between the principal point of the imaging forming lens 28 of the sensor unit 26 and a front side focal plane (an image capturing plane) of an optical image passing through the optical path length changing member 31 can be determined by the following formula:

$$L=Lc+Lp(1-1/n)$$

where Lc is the distance between the principal point of the imaging forming lens 28 of the sensor unit 26 and the reference chart 400.

When the refractive index n of the optical path length changing member 31 is 1.5, L=Lc+Lp(⅓), thereby enabling the optical path of the optical image passing through the optical path length changing member 31 to be extended by about ⅓ of the length Lp of the optical path length changing member 31 in the optical axial direction. In this case, when Lp=9 [mm], for example, L=Lc+3 [mm]. Thus, image capturing is performed with the difference between the distance from the sensor unit 26 to the reference chart 400 and the distance therefrom to the patch 200 being 3 mm, thereby enabling both a rear side focal plane (an imaging plane) of an optical image of the reference chart 400 and a rear side focal plane (an imaging plane) of an optical image of the patch 200 to be aligned with the light-receiving face of the two-dimensional image sensor 27 of the sensor unit 26.

The casing 23 includes a medium type determining light source 32 that irradiates the margin of the print medium P with light when determining the type of the print medium P. The medium type determining light source 32 is arranged at a position through which specular light emitted from the light source and regularly reflected by the margin of the print medium P enters the two-dimensional image sensor 27 of the sensor unit 26. The colorimetric camera 20 according to the present embodiment performs image capturing by the two-dimensional image sensor 27 with the margin of the print medium P irradiated with the light from the medium type determining light source 32 as a subject. The intensity of the specular light on the margin of the print medium P is determined from an obtained image, and based on the intensity of the specular light, the type of the print medium P is determined.

The colorimetric camera 20 according to the present embodiment performs image capturing by the two-dimensional image sensor 27 by turning on only the colorimetric light source 30 when performing the colorimetry of the patch 200 and by turning on only the medium type determining light source 32 when determining the type of the print medium P. The optical path length changing member 31 is an optical member having the function to bring the imaging plane of the optical image of the patch 200 close to the imaging plane of the optical image of the reference chart 400 when performing the colorimetry of the patch 200. However, the optical path length changing member 31 is arranged in the optical path of light directed from the medium type determining light source 32 toward a subject outside the casing 23. For this reason, when determining the type of the print medium P, the light from the medium type determining light source 32 enters the optical path length changing member 31. The specular light regularly reflected by, for example, the bottom face of the optical path length changing member 31 enters the light-receiving face of the two-dimensional image sensor 27, which may hinder the function to determine the type of the print medium P. In other words, when the optical image of the specular light regularly reflected by the margin of the print medium P and the optical image of the specular light regularly reflected by, for example, the bottom face of the optical path length changing member 31 overlap each other on the light-receiving face of the two-dimensional image sensor 27, the intensity of the specular light on the margin of the print medium P cannot be accurately determined by an image obtained by the image capturing of the two-dimensional image sensor 27, thus making it impossible to accurately determine the type of the print medium P.

In view of the above circumstances, the relative positional relation of the optical path length changing member 31 and the medium type determining light source 32 with respect to the two-dimensional image sensor 27 is set such that the optical image of the specular light regularly reflected by the margin of the print medium P and the optical image of the specular light regularly reflected by, for example, the bottom face of the optical path length changing member 31 do not overlap each other on the light-receiving face of the two-dimensional image sensor 27 when the medium type determining light source 32 is turned on in the colorimetric camera 20 according to the present embodiment.

Figure 5A:
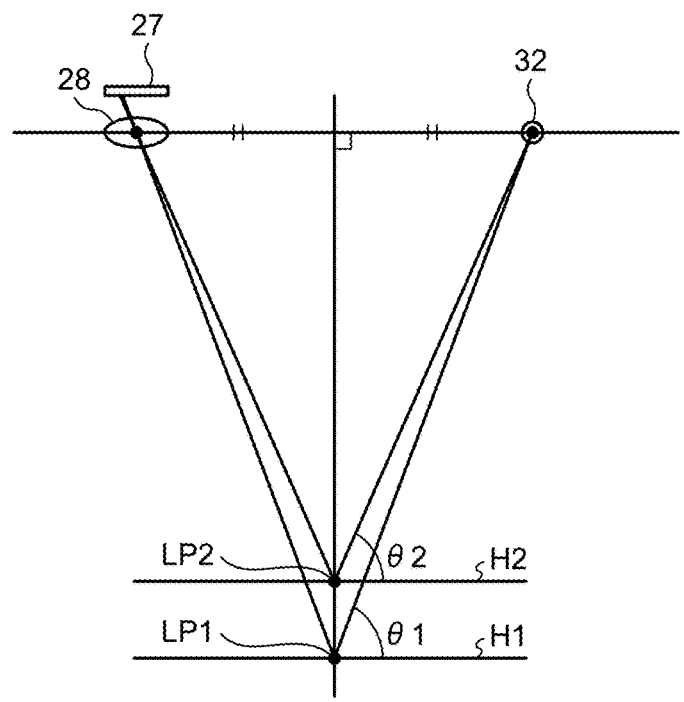
FIGS. 5A and 5B are diagrams illustrating an example in which the height position of an optical path length changing member with respect to a two-dimensional image sensor is changed with the position of a medium type determining light source with respect to the two-dimensional image sensor fixed.
Figure 5B:
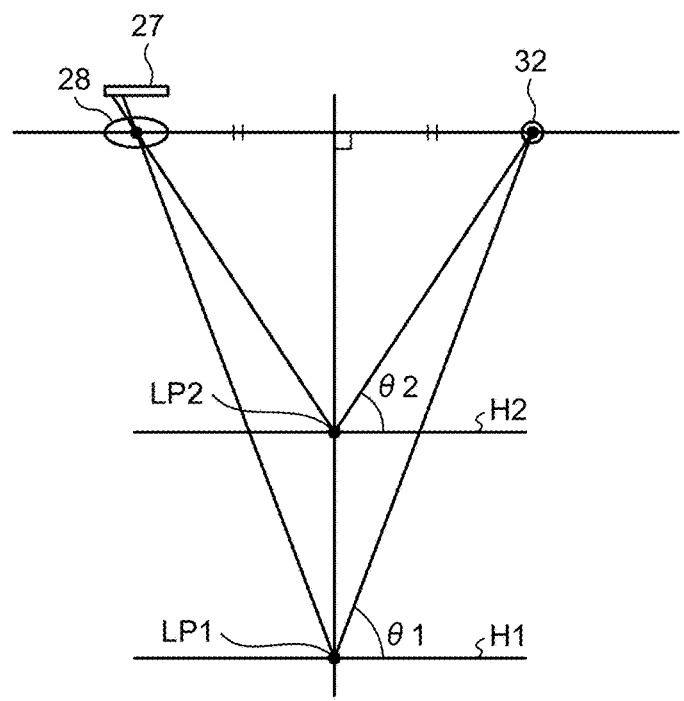
Figure 6A:
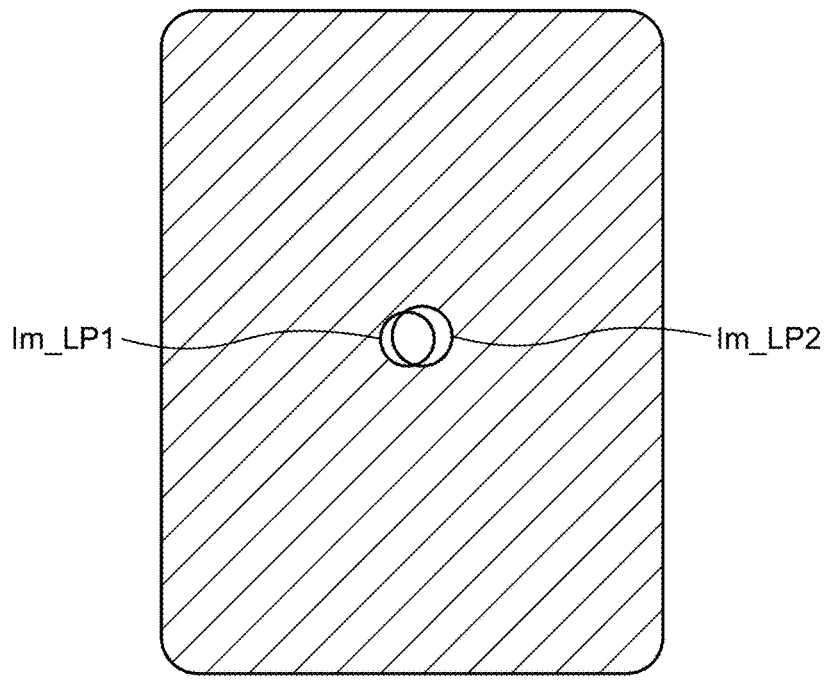
FIGS. 6A and 6B are diagrams illustrating images output by the two-dimensional image sensor in the state of FIGS. 5A and 5B, respectively.
Figure 6B:
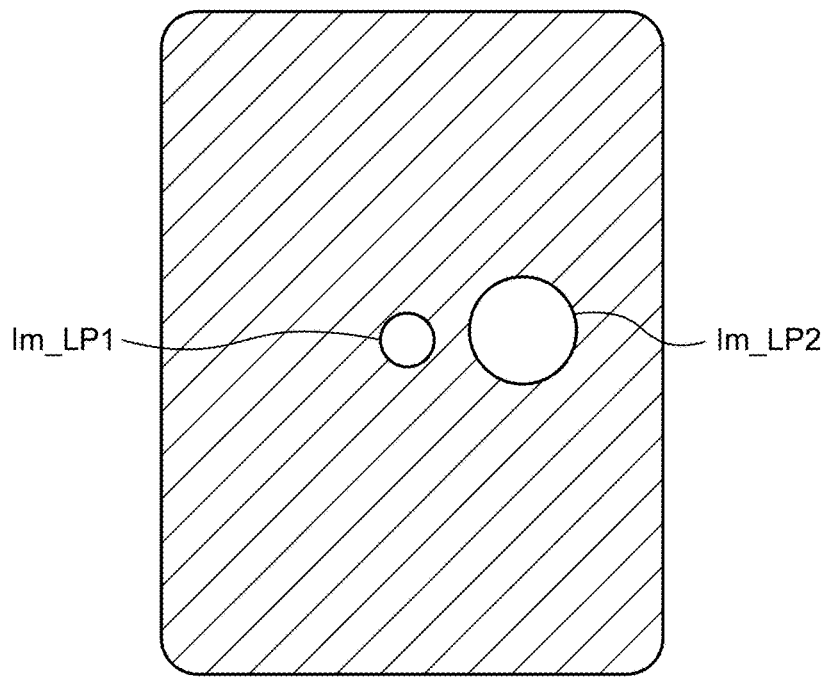

A more detailed description will be given with reference to FIGS. 5A and 5B and FIGS. 6A and 6B. FIGS. 5A and 5B are diagrams illustrating an example in which the height position of the optical path length changing member 31 with respect to the two-dimensional image sensor 27 is changed with the position of the medium type determining light source 32 with respect to the two-dimensional image sensor 27 fixed. FIGS. 6A and 6B are diagrams illustrating images output by the two-dimensional image sensor 27 in the state of FIGS. 5A and 5B, respectively. H1 in FIGS. 5A and 5B indicates the surface of the subject (the margin of the print medium P), whereas H2 indicates the bottom face of the optical path length changing member 31.

In order to make the description easy to understand, refraction of light by the optical path length changing member 31 is neglected. It is assumed that the height position of the imaging forming lens 28 that causes the optical image to be formed on the two-dimensional image sensor 27 and the height position of the medium type determining light source 32 are the same and that the line segment connecting between the imaging forming lens 28 and the medium type determining light source 32 is parallel to the surface H2 of the subject and the bottom face H2 of the optical path length changing member 31. The positional relation between the two-dimensional image sensor 27 and the imaging forming lens 28 is fixed. The distance from the two-dimensional image sensor 27 to the surface H2 of the subject is a fixed value obtained by adding the gap d to the size of the frame body 21.

When the height position of the imaging forming lens 28 and the height position of the medium type determining light source 32 are the same, a specular position (hereinafter, referred to as a first specular position) LP1 of the medium type determining light source 32 on the surface H2 of the subject (the print medium P) is a point of intersection at which the perpendicular bisector of the line segment connecting between the imaging forming lens 28 and the medium type determining light source 32 intersects the surface H2 of the subject. A specular position (hereinafter, referred to as a second specular position) LP2 of the medium type determining light source 32 on the bottom face H2 of the optical path length changing member 31 is a point of intersection at which the perpendicular bisector of the line segment connecting between the imaging forming lens 28 and the medium type determining light source 32 intersects the bottom face H2 of the optical path length changing member 31.

The first specular position LP1 and the second specular position LP2 overlap each other in the vertical view. However, when the height position of the imaging forming lens 28 and the height position of the medium type determining light source 32 are different from each other, the first specular position LP1 and the second specular position LP2 do not perfectly overlap each other in the vertical view, and deviation in accordance with the difference in the height position between the imaging forming lens 28 and the height position of the medium type determining light source 32 occurs.

As illustrated in FIG. 5A, when the bottom face H2 of the optical path length changing member 31 is positioned close to the surface H2 of the subject, the difference $\Delta\theta$ between an incident angle $\theta 1$ from the medium type determining light source 32 toward the first specular position LP1 and an incident angle $\theta 2$ from the medium type determining light source 32 toward the second specular position LP2 is small. As a result of this, an optical image Im_LP1 of the first specular position LP1 and an optical image Im_LP2 of the second specular position LP2 are formed at positions close to each other on the light-receiving face of the two-dimensional image sensor 27. In the image output by the two-dimensional image sensor 27, as illustrated in FIG. 6A, the optical image Im_LP1 of the first specular position LP1 and the optical image Im_LP2 of the second specular position LP2 overlap each other. When the optical image Im_LP1 of the first specular position LP1 and the optical image Im_LP2 of the second specular position LP2 overlap each other, the intensity of the specular light on the subject (the print medium P) cannot be accurately determined, and the type of the print medium P cannot be accurately determined.

Meanwhile, as illustrated in FIG. 5B, when the bottom face H2 of the optical path length changing member 31 is moved away from the surface H2 of the subject, the difference $\Delta\theta$ between the incident angle $\theta 1$ from the medium type determining light source 32 toward the first specular position LP1 and the incident angle 82 from the medium type determining light source 32 toward the second specular position LP2 increases. In other words, the optical path length changing member 31 is arranged at a higher position (a position close to the substrate 22) within the casing 23, thereby enabling the difference $\Delta\theta$ between the incident angle $\theta 1$ and the incident angle $\theta 2$ to increase. When the difference $\Delta\theta$ between the incident angle $\theta 1$ and the incident angle $\theta 2$ increases, the position of the optical image Im_LP1 of the first specular position LP1 formed on the light-receiving face of the two-dimensional image sensor 27 and the position of the optical image Im_LP2 of the second specular position LP2 separate from each other. In the image output by the two-dimensional image sensor 27, as illustrated in FIG. 6B, the optical image Im_LP1 of the first specular position LP1 and the optical image Im_LP2 of the second specular position LP2 separate from each other. Thus, the optical image Im_LP1 of the first specular position LP1 is detected from this image, thereby enabling the intensity of the specular light on the subject (the print medium P) to be accurately determined, and enabling the type of the print medium P to be accurately determined.

Thus, in the colorimetric camera 20 according to the present embodiment, the relative positional relation of the optical path length changing member 31 and the medium type determining light source 32 with respect to the two-dimensional image sensor 27 is set such that the difference $\Delta\theta$ between the incident angle $\theta 1$ from the medium type determining light source 32 toward the first specular position LP1 and the incident angle $\theta 2$ from the medium type determining light source 32 toward the second specular position LP2 is a reference value $\theta$th or more. The reference value $\theta$th is a value determined by simulation or the like with which the optical image Im_LP1 of the first specular position LP1 and the optical image Im_LP2 of the second specular position LP2 do not overlap each other on the light receiving face of the two-dimensional image sensor 27.

The reference value θth may be larger than the value with which the optical image Im_LP1 of the first specular position LP1 and the optical image Im_LP2 of the second specular position LP2 do not overlap each other on the light receiving face of the two-dimensional image sensor 27 and may be a value with which the optical image Im_LP2 of the second specular position LP2 is outside the light-receiving face of the two-dimensional image sensor 27. In other words, a value may be determined by simulation or the like with which the optical image Im_LP1 of the first specular position LP1 enters the light-receiving face of the two-dimensional image sensor 27 and the optical image Im_LP2 of the second specular position LP2 does not enter the two-dimensional image sensor 27, and this value may be used as the reference value θth. This case provides an advantage in that the optical image Im_LP1 of the first specular position LP1 can be simply detected from the image output by the two-dimensional image sensor 27.

As a specific method of layout for causing the difference Δθ between the incident angle θ1 and the incident angle θ2 to be the reference value θth or more, as described above, there is a method that arranges the optical path length changing member 31 at the higher position (the position close to the substrate 22) within the casing 23, thereby increasing the difference Δθ. Instead of arranging the optical path length changing member 31 at the higher position (the position close to the substrate 22) within the casing 23, the medium type determining light source 32 may be arranged at a lower position within the casing 23, or the medium type determining light source 32 may be arranged at a position further departed from the two-dimensional image sensor 27, thereby increasing the difference Δθ. These methods may be combined, thereby increasing the difference Δθ. By any of these methods, the relative positional relation of the optical path length changing member 31 and the medium type determining light source 32 with respect to the two-dimensional image sensor 27 is set such that the difference Δθ between the incident angle θ1 and the incident angle θ2 is the reference value θth or more in the colorimetric camera 20 according to the present embodiment.

Specific Example of Reference Chart

Figure 7:
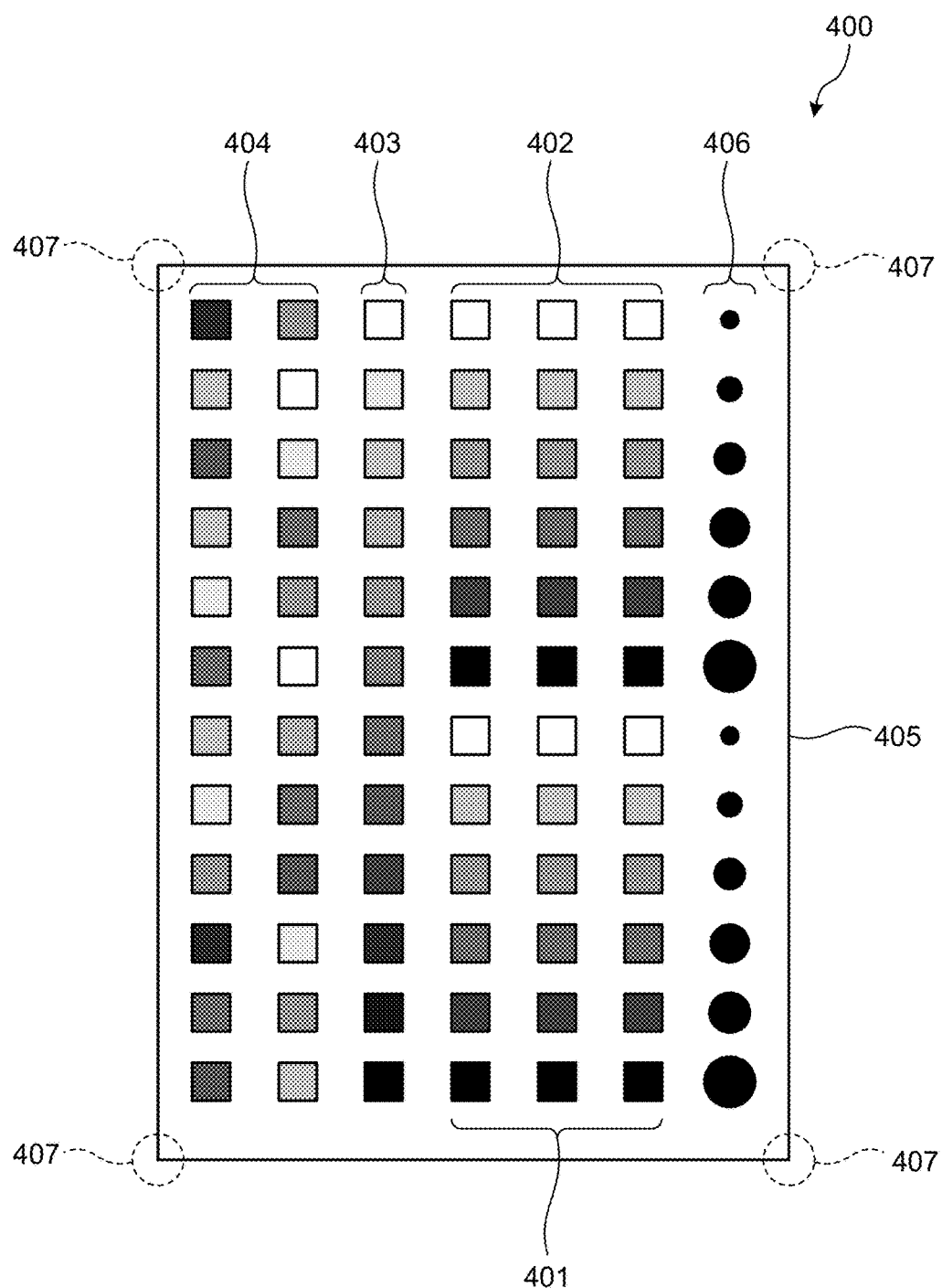
FIG. 7 is a diagram illustrating a specific example of a reference chart.

Next, the reference chart 400 arranged within the casing 23 of the colorimetric camera 20 will be described in detail with reference to FIG. 7. FIG. 7 is a diagram illustrating a specific example of the reference chart 400.

The reference chart 400 illustrated in FIG. 7 contains a plurality of reference patch arrays 401 to 404 that arrange colorimetric reference patches, a dot diameter measuring pattern array 406, a distance measuring line 405, and chart position specifying markers 407.

The reference patch arrays 401 to 404 contain the reference patch array 401 that arranges YMCK primary color reference patches in order of gradation, the reference patch array 402 that arranges RGB secondary color reference patches in order of gradation, the reference patch array 403 (an achromatic color gradation pattern) that arranges gray scale reference patches in order of gradation, and the reference patch array 404 that arranges tertiary color reference patches. The dot diameter measuring pattern array 406 is a pattern array for geometrical shape measurement that arranges circular patterns having different sizes in order of size and can be used for the measuring the dot diameter of an image printed on the print medium P.

The distance measuring line 405 is formed as a rectangular frame that surrounds the reference patch arrays 401 to 404 and the dot diameter measuring pattern array 406. The chart position specifying markers 407 are arranged at the four corners of the distance measuring line 405 and function as markers that specify the positions of the respective reference patches. The distance measuring line 405 and the chart position specifying markers 407 at the four corners are specified from an image of the reference chart 400 captured by the sensor unit 26, thereby enabling the position of the reference chart 400 and the positions of the respective reference patches and patterns to be specified.

The respective reference patches constituting the colorimetric reference patch arrays 401 to 404 are used as references of hues reflecting image capturing conditions of the colorimetric camera 20. The configuration of the colorimetric reference patch arrays 401 to 404 arranged on the reference chart 400 is not limited to the example illustrated in FIG. 7, and any reference patch array can be used. For example, a reference patch that can specify a color range as widely as possible may be used, and the YMCK primary color reference patch array 401 and the gray scale reference patch array 403 may be formed by patches of colorimetric values of ink used in the image forming apparatus 100. The RGB secondary color reference patch array 402 may be formed by patches of colorimetric values that can be developed by ink used in the image forming apparatus 100 or may be reference color charts whose colorimetric values are defined such as Japan Color.

Although the present embodiment uses the reference chart 400 having the reference patch arrays 401 to 404 of the general path (color chart) shape, the reference chart 400 is not necessarily required to be a form having such reference patch arrays 401 to 404. The reference chart 400 is only required to be configured so that a plurality of colors usable for colorimetry are arranged so that their respective positions can be specified.

The reference chart 400 is arranged adjacent to the opening 25 on the bottom face 23a of the casing 23 of the colorimetric camera 20, and the image thereof can be captured simultaneously with the image of the patch 200 as a colorimetric object by the sensor unit 26. Being captured simultaneously means that image data of one frame containing the patch 200 as a colorimetric object and the reference chart 400 is acquired. In other words, acquisition of image data containing the patch 200 and the reference chart 400 within one frame, even when there is a time difference in pixel-by-pixel data acquisition, means that the images of the patch 200 and the reference chart 400 are simultaneously captured.

The above-described mechanical configuration of the colorimetric camera 20 is an example, and it is not limited thereto. The colorimetric camera 20 according to the present embodiment is only required to be able to at least perform the colorimetry of the patch 200 and determine the paper type of the print medium P using the two-dimensional image sensor 27, and various alterations and modifications can be applied to the above configuration.

Although the present embodiment has a function as a medium type determining apparatus in the colorimetric camera 20 that performs the colorimetry of the patch 200, the medium type determining apparatus may be implemented by another image capturing apparatus other than the colorimetric camera 20. In this case, the other image capturing apparatus other than the colorimetric camera 20 includes a two-dimensional image sensor similar to the two-dimensional image sensor 27 and a light source corresponding to the medium type determining light source 32. The image capturing apparatus other than the colorimetric camera 20 includes an optical member arranged in an optical path of light emitted from the light source to the subject. The relative positional relation of the optical member and the light source with respect to the two-dimensional image sensor is determined so that the difference Δθ between the incident angle θ1 from the light source toward a specular position (the first specular position LP1) on the subject and the incident angle θ2 from the light source toward a specular position (the second specular position LP2) on the optical member is the reference value θth or more.

Outline of Control Mechanism of Image Forming Apparatus

Figure 8:
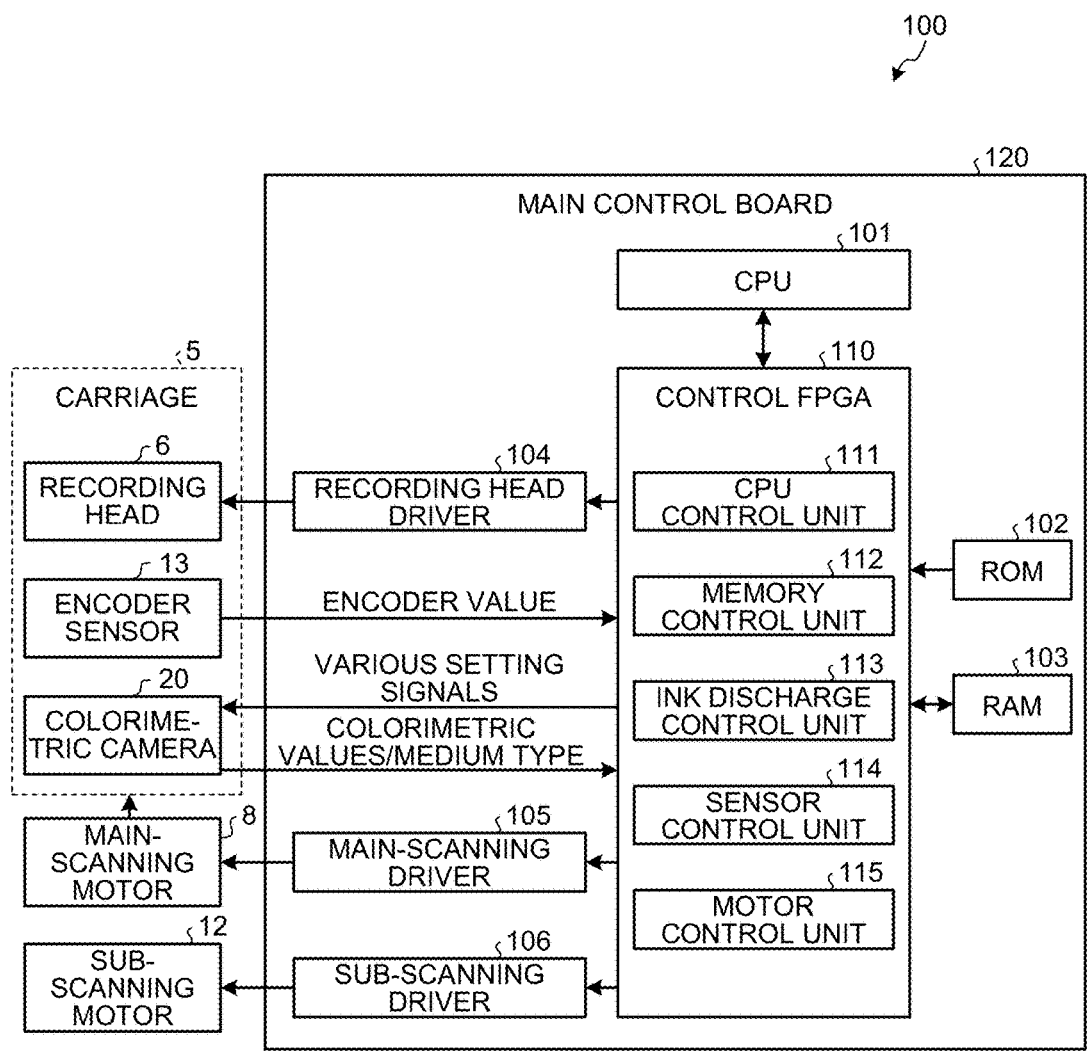
FIG. 8 is a control block diagram of the image forming apparatus.

Next, a control mechanism of the image forming apparatus 100 according to the present embodiment will be outlined with reference to FIG. 8. FIG. 8 is a block diagram outlining the control mechanism of the image forming apparatus 100.

As illustrated in FIG. 8, the image forming apparatus 100 according to the present embodiment includes a CPU 101, a ROM 102, a RAM 103, a recording head driver 104, a main-scanning driver 105, a sub-scanning driver 106, a control field-programmable gate array (FPGA) 110, the recording head 6, the colorimetric camera 20, the encoder sensor 13, the main-scanning motor 8, and a sub-scanning motor 12. The CPU 101, the ROM 102, the RAM 103, the recording head driver 104, the main-scanning driver 105, the sub-scanning driver 106, and the control FPGA 110 are mounted on a main control board 120. The recording head 6, the encoder sensor 13, and the colorimetric camera 20 are mounted on the carriage 5 as described above.

The CPU 101 controls the entire image forming apparatus 100. For example, the CPU 101, while using the RAM 103 as a work area, executes various control programs stored in the ROM 102 and outputs control commands for controlling various operations in the image forming apparatus 100.

The recording head driver 104, the main-scanning driver 105, and the sub-scanning driver 106 are drivers for driving the recording head 6, the main-scanning motor 8, and the sub-scanning motor 12, respectively.

The control FPGA 110 controls the various operations in the image forming apparatus 100 in cooperation with the CPU 101. The control FPGA 110 includes as functional components, for example, a CPU control unit 111, a memory control unit 112, an ink discharge control unit 113, a sensor control unit 114, and a motor control unit 115.

The CPU control unit 111 communicates with the CPU 101, thereby transmitting various types of information acquired by the control FPGA 110 to the CPU 101 and inputting the control commands output from the CPU 101.

The memory control unit 112 performs memory control for causing the CPU 101 to access the ROM 102 and the RAM 103.

The ink discharge control unit 113 controls the operation of the recording head driver 104 in accordance with the control commands from the CPU 101, thereby controlling the discharge timing of ink from the recording head 6 driven by the recording head driver 104.

The sensor control unit 114 performs processing on sensor signals such as an encoder value output from the encoder sensor 13.

The motor control unit 115 controls the operation of the main-scanning driver 105 in accordance with the control commands from the CPU 101, thereby controlling the main-scanning motor 8 driven by the main-scanning driver 105 and controlling the movement of the carriage 5 in the main-scanning direction. The motor control unit 115 controls the operation of the sub-scanning driver 106 in accordance with the control commands from the CPU 101, thereby controlling the sub-scanning motor 12 driven by the sub-scanning driver 106 and controlling the movement of the print medium P in the sub-scanning direction on the platen 16.

The above components are examples of control functions implemented by the control FPGA 110, and various control functions other than these may be implemented by the control FPGA 110. The whole or part of the above control functions may be implemented by computer programs executed by the CPU 101 or another general-purpose CPU. Part of the above control functions may be implemented by special-purpose hardware such as another FPGA other than the control FPGA 110 and an application specific integrated circuit (ASIC).

The recording head 6 is driven by the recording head driver 104 whose operation is controlled by the CPU 101 and the control FPGA 110 and discharges ink onto the print medium P on the platen 16 to print an image.

As described above, the colorimetric camera 20 captures the images of the respective patches 200 contained in the test pattern together with the image of the reference chart 400 at the time of the color adjustment of the image forming apparatus 100, and based on the RGB values of the patches 200 obtained from a captured image and the RGB values of the respective reference patches of the reference chart 400, calculates the colorimetric values (which are color specification values in a standard color space and are L*a*b* values (hereinafter, L*a*b* will be denoted as "Lab")) in an L*a*b* color space, for example) of the patch 200. The colorimetric values of the patches 200 calculated by the colorimetric camera 20 are sent to the CPU 101 through the control FPGA 110. A specific example of the method of the colorimetry of the patches 200 in the present embodiment will be described in detail below.

As described above, the color adjustment of the image forming apparatus 100 may be performed by using the RGB values of the patches 200. In this case, the colorimetric camera 20 captures an image of each of the patches 200 contained in the test pattern together with the image of the reference chart 400 by the two-dimensional image sensor 27, and performs processing to correct errors due to a change in the colorimetric light source 30 with respect to the RGB values of the patches 200 obtained from the captured image, by using the RGB values of the respective reference patches of the reference chart 400. The corrected RGB value of the patch 200 is sent from the colorimetric camera 20 to the CPU 101 through the control FPGA 110, for example. The CPU 101 adjusts a parameter or the like for controlling the amount of discharge of the ink by using the RGB value, thereby adjusting the amount of ink discharged from the recording head 6 to the print medium P.

As described above, the colorimetric camera 20 irradiates the margin of the print medium P on which no patch 200 is formed with light from the medium type determining light source 32 before performing the colorimetry of the respective patches 200 contained in the test pattern to capture the image of the print medium P. The colorimetric camera 20 determines the intensity of the specular light on the print medium P from the image obtained by the image capturing, and based on the intensity of the specular light, determines the type of the print medium P. Information indicating the type of the print medium P determined by the colorimetric camera 20 is sent to the CPU 101 through the control FPGA 110.

The encoder sensor 13 outputs the encoder value obtained by detecting the mark of the encoder sheet 14 to the control FPGA 110. The encoder value is then sent from the control FPGA 110 to the CPU 101 and is used for, for example, calculating the position and speed of the carriage 5. Based on the position and speed of the carriage 5 calculated from the encoder value, the CPU 101 generates and outputs control commands for controlling the main-scanning motor 8.

Configuration of Control Mechanism of Colorimetric Camera

Figure 9:
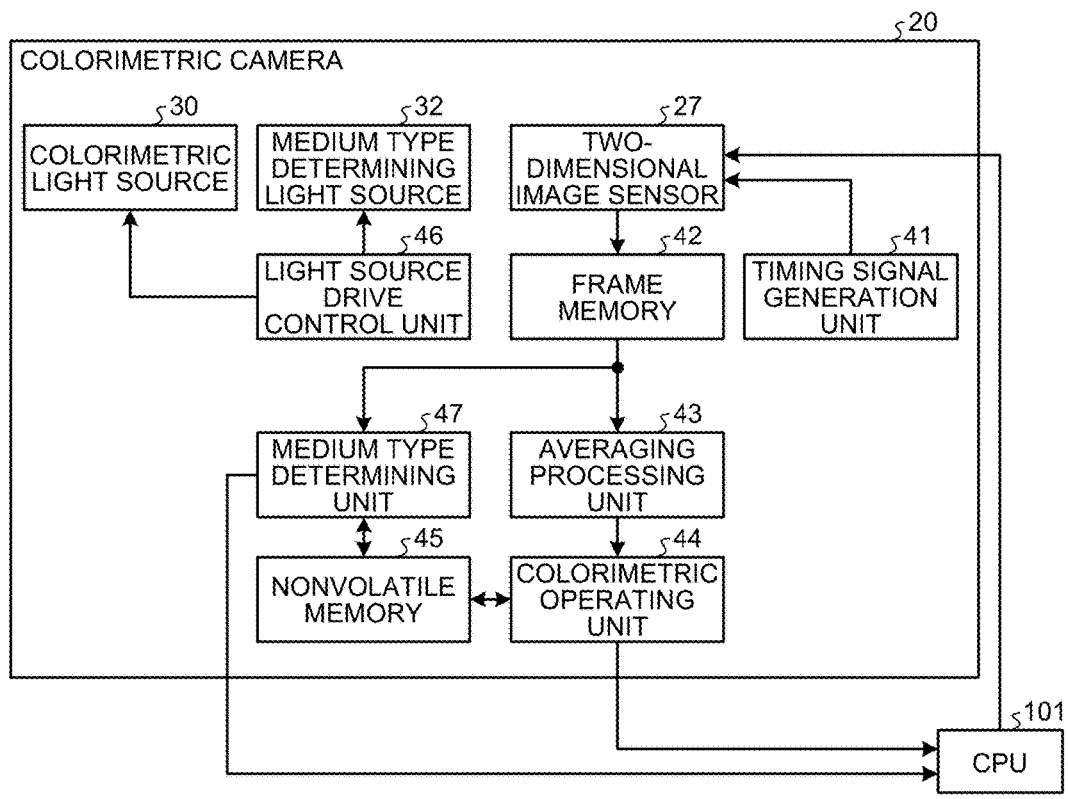
FIG. 9 is a control block diagram of the colorimetric camera.

Next, a control mechanism of the colorimetric camera 20 will be described specifically with reference to FIG. 9. FIG. 9 is a block diagram illustrating a configuration example of the control mechanism of the colorimetric camera 20.

As illustrated in FIG. 9, the colorimetric camera 20 includes the two-dimensional image sensor 27, the colorimetric light source 30, the medium type determining light source 32, a timing signal generation unit 41, a frame memory 42, an averaging processing unit 43, a colorimetric operating unit 44, a nonvolatile memory 45, a light source drive control unit 46, and a medium type determining unit 47.

The two-dimensional image sensor 27 converts light incident through the imaging forming lens 28 into an electric signal and outputs image data obtained by capturing the image of the image capturing object area of the sensor unit 26. The two-dimensional image sensor 27 has the function that AD-converts an analog signal obtained by photoelectric conversion into digital image data, performs various types of image processing such as shading correction, white balance correction, γ correction, and image data format conversion on the image data, and outputs the resulting image data. Part or the whole of the various types of image processing on the image data may be performed outside the two-dimensional image sensor 27.

The timing signal generation unit 41 generates a timing signal that controls the timing of start of image capturing by the two-dimensional image sensor 27 and supplies the timing signal to the two-dimensional image sensor 27. The present embodiment performs image capturing by the two-dimensional image sensor 27 not only when the colorimetry of the patch 200 is performed, but also when the type of the print medium P is determined. The timing signal generation unit 41 generates the timing signal that controls the timing of start of image capturing by the two-dimensional image sensor 27 when performing the colorimetry of the patch 200 and at the determination of the type of the print medium P and supplies the timing signal to the two-dimensional image sensor 27.

The frame memory 42 temporarily stores therein the image output by the two-dimensional image sensor 27.

The averaging processing unit 43 extracts an area to be subjected to colorimetry set near the central part of a subject area and an area reflecting the respective reference patches of the reference chart 400 from the image output by the two-dimensional image sensor 27 and temporarily stored in the frame memory 42 when performing the colorimetry of the patch 200. The averaging processing unit 43 averages the image data of the extracted area to be subjected to colorimetry, outputs the obtained values to the colorimetric operating unit 44 as the RGB values of the patch 200 as a colorimetric object, averages each of the pieces of image data reflecting the respective reference patches, and outputs the obtained values to the colorimetric operating unit 44 as the RGB values of the respective reference patches.

The colorimetric operating unit 44 calculates the colorimetric values of the patch 200 based on the RGB values of the patch 200 obtained by the processing by the averaging processing unit 43 and the RGB values of the respective patches of the reference chart 400. The colorimetric values of the patch 200 calculated by the colorimetric operating unit 44 are sent to the CPU 101 on the main control board 120. A specific example of the processing to calculate the colorimetric values of the patch 200 by the colorimetric operating unit 44 will be described in detail below.

The nonvolatile memory 45 stores therein various types of data required for calculating the colorimetric values of the patch 200 by the colorimetric operating unit 44, a table to which the medium type determining unit 47 refers when determining the type of the print medium P, or the like.

The light source drive control unit 46 generates light source drive signals for turning on the colorimetric light source 30 and the medium type determining light source 32 and supplies the signals to the colorimetric light source 30 and the medium type determining light source 32. As described above, the colorimetric camera 20 according to the present embodiment turns on the colorimetric light source 30 when performing the colorimetry of the patch 200 and turns on the medium type determining light source 32 when determining the type of the print medium P. The light source drive control unit 46 supplies a light source drive signal for turning on the colorimetric light source 30 to the colorimetric light source 30 when performing the colorimetry of the patch 200 and supplies a light source drive signal for turning on the medium type determining light source 32 to the medium type determining light source 32 when determining the type of the print medium P.

The medium type determining unit 47 determines the type of the print medium P on which the test pattern containing the patch 200 is printed. The determination of the type of the print medium P is performed, for example, prior to the colorimetry of the patch 200.

When determining the type of the print medium P, the light from the medium type determining light source 32 is applied to the margin of the print medium P. Reflected light from the print medium P including specular light of the medium type determining light source 32 is received by the two-dimensional image sensor 27, thereby outputting an image from the two-dimensional image sensor 27. The medium type determining unit 47 detects an optical image of the specular light regularly reflected by the margin of the print medium P from the image output by the two-dimensional image sensor 27 and determines the intensity of the specular light from the brightness value of the optical image. The medium type determining unit 47 refers to the table stored in advance in the nonvolatile memory 45 and determines the type of the print medium P corresponding to the determined intensity of the specular light, thereby determining the type of the print medium P. Information indicating the type of the print medium P determined by the medium type determining unit 47 is sent to the CPU 101 on the main control board 120 and is used for, for example, correcting the colorimetric values of the patch 200 calculated by the colorimetric operating unit 44 in accordance with the type of the print medium P.

The table referred to by the medium type determining unit 47 describes the intensity of specular light for each of the types of the print medium P handled by the image forming apparatus 100. The table is created in advance by, for example, performing experiments that determine the intensity of the specular light for each of the types of the print medium P and is stored in the nonvolatile memory 45.

Although the present embodiment describes a case in which the type of the print medium P on which the test pattern containing the patch 200 as a colorimetric object is printed is determined, the medium type determining unit 47 can determine, not only the print medium P on which the test pattern is printed, but also types of various print media P for use in the printing by the image forming apparatus 100.

Specific Example of Method of Colorimetry of Patches

Next, a specific example of the method of the colorimetry of the patches 200 by the image forming apparatus 100 according to the present embodiment will be described in detail with reference to FIG. 10 to FIG. 16. The method of colorimetry described below includes preprocessing that is performed when the image forming apparatus 100 is in an initial state (when being in the initial state after manufacture, an overhaul, or the like) and colorimetric processing that is performed at the time of adjustment that performs the color adjustment of the image forming apparatus 100.

Figure 10:
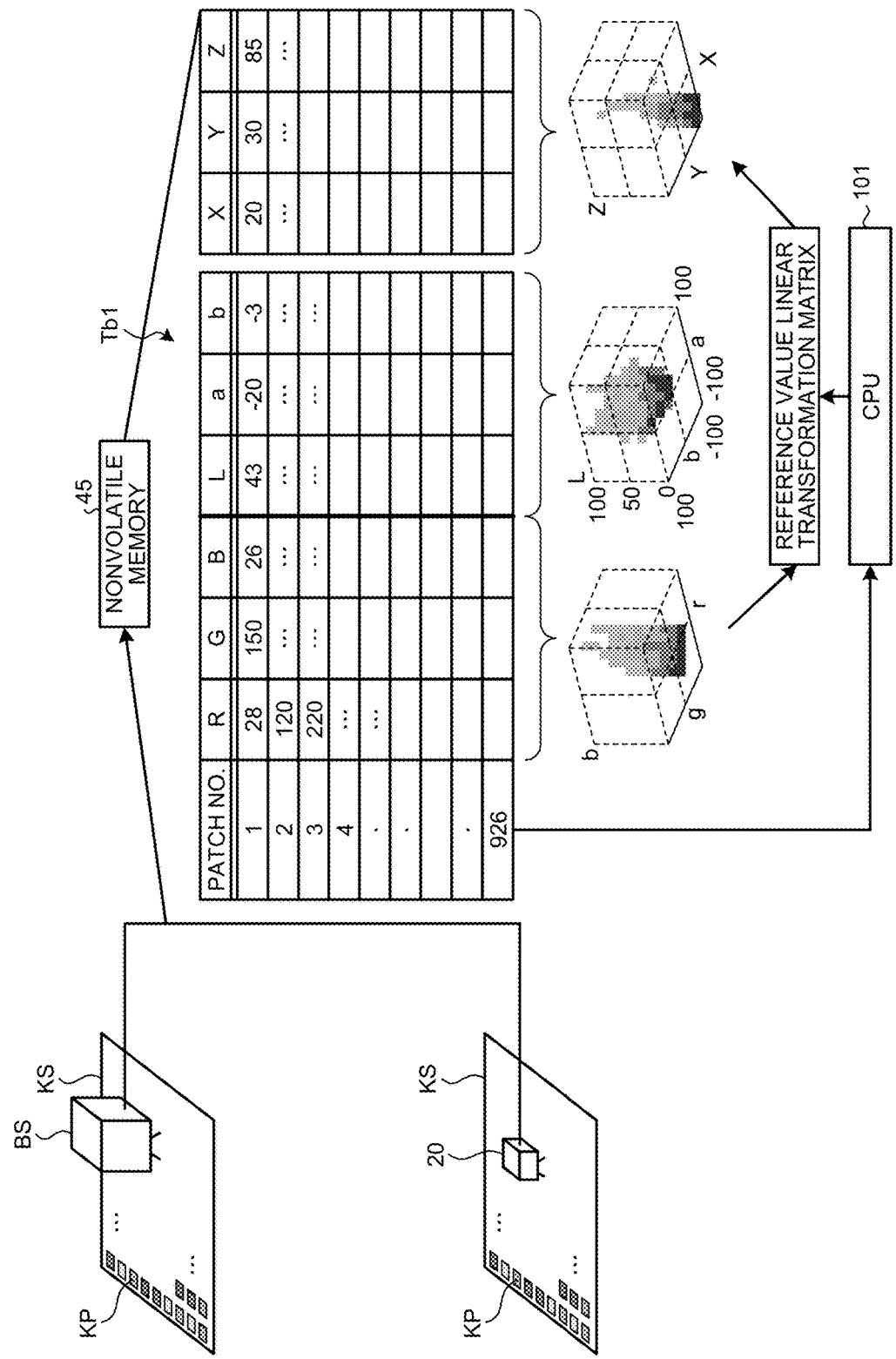
FIG. 10 is a diagram illustrating processing to acquire reference colorimetric values and reference RGB values and processing to generate a reference value linear transformation matrix.

FIG. 10 is a diagram illustrating processing to acquire reference colorimetric values and reference RGB values and processing to generate a reference value linear transformation matrix. These pieces of processing illustrated in FIG. 10 are performed as the preprocessing. In the preprocessing, a reference sheet KS on which a plurality of reference patches KP are arranged and formed. The reference patches KP of the reference sheet KS are similar to the patches of the reference chart 400 of the colorimetric camera 20.

First, at least either one of Lab values and XYZ values (both the Lab values and the XYZ values in the example in FIG. 10) as colorimetric values of the reference patches KP of the reference sheet KS is stored in a memory table Tb1 provided in, for example, the nonvolatile memory 45 mounted on the substrate 22 of the colorimetric camera 20 in association with respective patch numbers. The colorimetric values of the reference patches KP are values obtained in advance by colorimetry using a spectrometer BS or the like. When the colorimetric values of the reference patches KP are known, the values may be used. The colorimetric values of the reference patches KP stored in the memory table Tb 1 will be referred to as "reference colorimetric values" below.

Next, the reference sheet KS is set on the platen 16, and the movement of the carriage 5 is controlled, thereby performing image capturing by the colorimetric camera 20 with the reference patches KP of the reference sheet KS as a subject. The RGB values of the reference patches KP obtained by the image capturing by the colorimetric camera 20 are stored in the memory table Tb1 of the nonvolatile memory 45 in association with the patch numbers. In other words, the memory table Tb1 stores therein the colorimetric values and RGB values of the respective reference patches KP arranged and formed on the reference sheet KS in association with the patch numbers of the respective reference patches KP. The RGB values of the reference patches KP stored in the memory table Tb 1 will be referred to as "reference RGB values" below. The reference RGB values are values reflecting the characteristics of the colorimetric camera 20.

When the reference colorimetric values of the reference patches KP and the reference RGB values are stored in the memory table Tb 1 of the nonvolatile memory 45, the CPU 101 of the image forming apparatus 100 generates, for pairs of the XYZ values as the reference colorimetric values and the reference RGB values having the same patch number, a reference value linear transformation matrix that mutually transforms these values and stores the matrix in the nonvolatile memory 45. When only the Lab values as the reference colorimetric values are stored in the memory table Tb 1, the reference value linear transformation matrix may be generated after transforming the Lab values into the XYZ values using a known transformation formula.

Figures 11A, 11B:
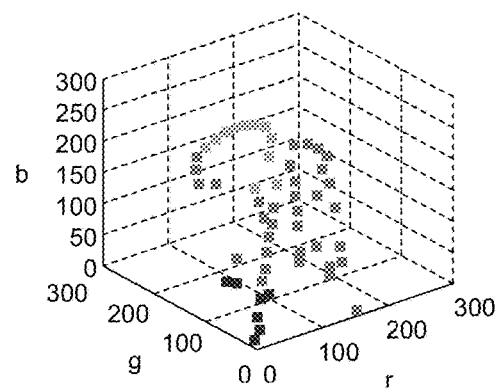
FIGS. 11A and 11B are diagrams illustrating an example of initial reference RGB values.

When the colorimetric camera 20 captures the image of the reference patches KP of the reference sheet KS, the image of the reference chart 400 provided in the colorimetric camera 20 is also captured simultaneously. The RGB values of the respective patches of the reference chart 400 obtained by the image capturing are also stored in the memory table Tb1 of the nonvolatile memory 45 in association with the patch numbers. The RGB values of the patches of the reference chart 400 stored in the memory table Tb1 by this preprocessing are referred to as "initial reference RGB values." FIGS. 11A and 11B are diagrams illustrating an example of the initial reference RGB values. FIG. 11A illustrates a state in which the initial RGB reference values (RdGdBd) are stored in the memory table Tb1 and illustrates that, together with the initial RGB reference values (RdGdBd), initial reference Lab values (Ldadbd) and initial reference XYZ values (XdYdZd) obtained by transforming the initial RGB reference values (RdGdBd) into the Lab values and the XYZ values, respectively, are also stored therein in association therewith. FIG. 11B is a scatter diagram plotting the initial reference RGB values of the respective patches of the reference chart 400.

Upon completion of the above preprocessing, based on image data, print settings, or the like input externally, the image forming apparatus 100, under the control of the CPU 101, drives the main-scanning motor 8, the sub-scanning motor 12, and the recording head 6, thereby moving the carriage 5 in the main-scanning direction, while intermittently conveying the print medium P in the sub-scanning direction, and discharges ink from the recording head 6, thereby printing an image on the print medium P. In this situation, the amount of discharge of the ink from the recording head 6 may change due to device-unique characteristics, changes with time, or the like, and if the amount of discharge of the ink changes, image formation is performed in colors different from colors intended by a user, thus degrading color reproducibility. In view of this, the image forming apparatus 100 performs colorimetric processing to determine the colorimetric values of the patch 200 contained in the test chart printed on the print medium P at certain timing performing color adjustment. Generation or modification of a device profile is performed based on the colorimetric values of the patch 200 obtained by the colorimetric processing, and the color adjustment is performed based on the device profile, thereby increasing the color reproducibility of an output image.

Figure 12:
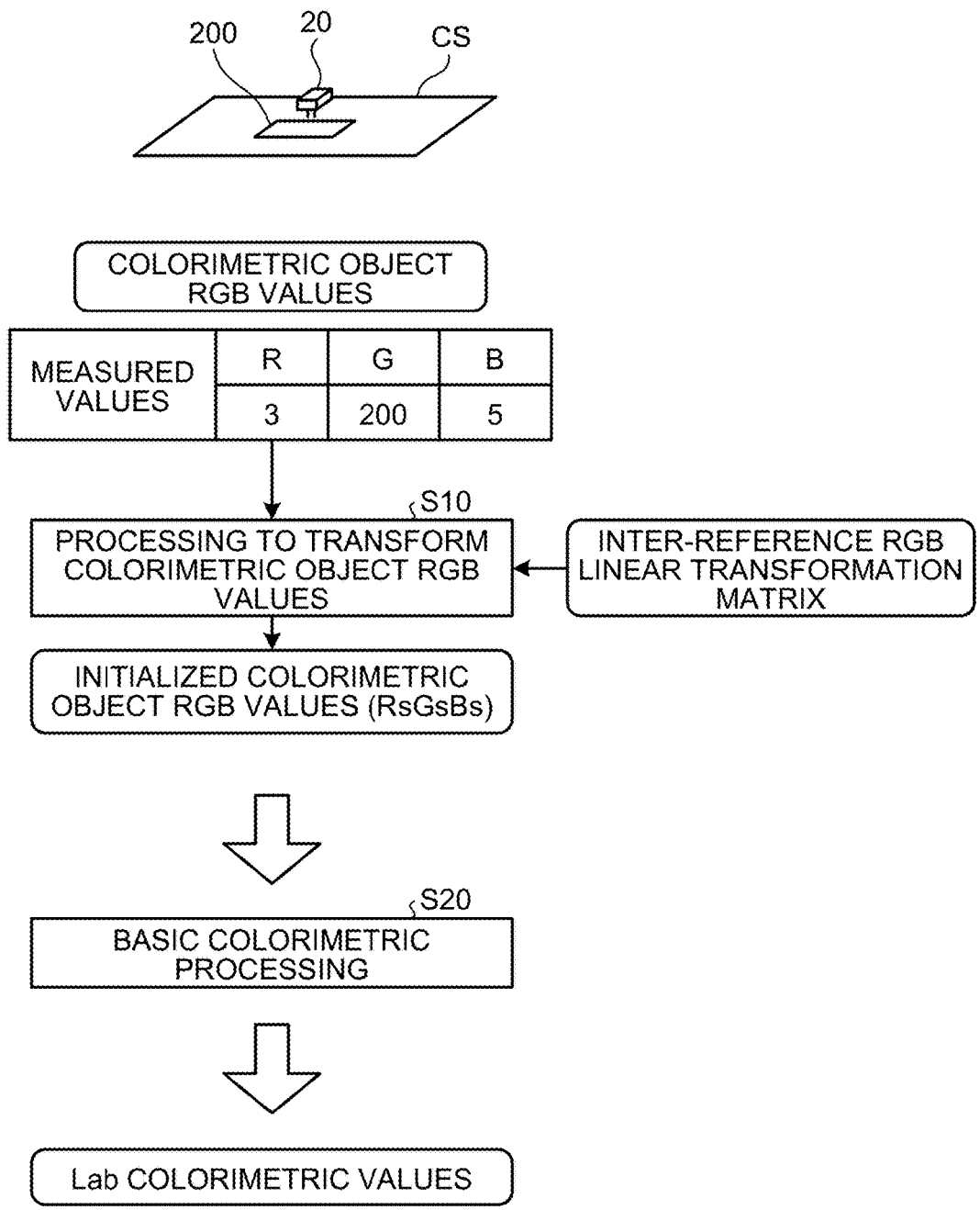
FIG. 12 is a diagram outlining colorimetric processing.

FIG. 12 is a diagram outlining the colorimetric processing. The image forming apparatus 100, at the time of adjustment that performs the color adjustment, first discharges ink from the recording head 6 onto the print medium P set on the platen 16 to print a test pattern on which many patches 200 are arranged. The print medium P on which the test pattern is printed will be referred to as an "adjustment sheet CS" below. The adjustment sheet CS prints the patches 200 reflecting output characteristics at the time of the adjustment of the image forming apparatus 100, especially the output characteristics of the recording head 6. Image data for printing the test pattern is stored in advance in the nonvolatile memory 45 or the like.

Next, as illustrated in FIG. 12, in a state in which the adjustment sheet CS is set on the platen 16 or in which the adjustment sheet CS is held on the platen 16 without being ejected when the sheet is created, the image forming apparatus 100 performs image capturing by the two-dimensional image sensor 27 of the colorimetric camera 20 while moving the carriage 5 in the main-scanning direction on the adjustment sheet CS. From image data output from the two-dimensional image sensor 27, the RGB values of the patch 200 are determined by the processing by the averaging processing unit 43. The two-dimensional image sensor 27 captures the image of the reference chart 400 simultaneously with the image of the patch 200 as a colorimetric object, and the RGB values of the respective patches contained in the reference chart 400 are also determined. The RGB values of the patch 200 as a colorimetric object will be referred to as "colorimetric object RGB values", and the RGB values of the patches of the reference chart 400 will be referred to as "reference RGB values at colorimetry (RdsGdsBds)." The "reference RGB values at colorimetry (RdsGdsBds)" are stored in the nonvolatile memory 45 or the like.

The colorimetric operating unit 44 of the colorimetric camera 20 performs processing to transform the colorimetric object RGB values into initialized colorimetric object RGB values (RsGsBs) using an inter-reference RGB linear transformation matrix described below (Step S10). The initialized colorimetric object RGB values (RsGsBs) are values obtained by excluding the influence of changes with time of the image capturing conditions of the colorimetric camera 20 occurring in the duration from the initial state performing the preprocessing to the time of adjustment performing the colorimetric processing, that is, changes with time of the colorimetric light source 30 and changes with time of the two-dimensional image sensor 27, for example, from the colorimetric object RGB values.

The colorimetric operating unit 44 then performs basic colorimetric processing described below (Step S20) on the initialized colorimetric object RGB values (RsGsBs), thereby acquiring Lab values as the colorimetric values of the patch 200 as a colorimetric object.

Figure 13:
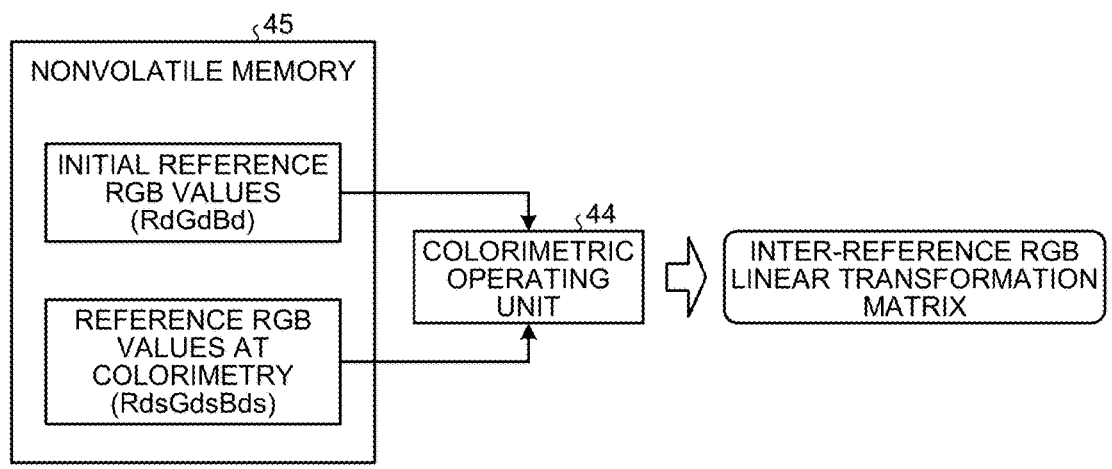
FIG. 13 is a diagram illustrating processing to generate an inter-reference RGB linear transformation matrix.
Figure 14:
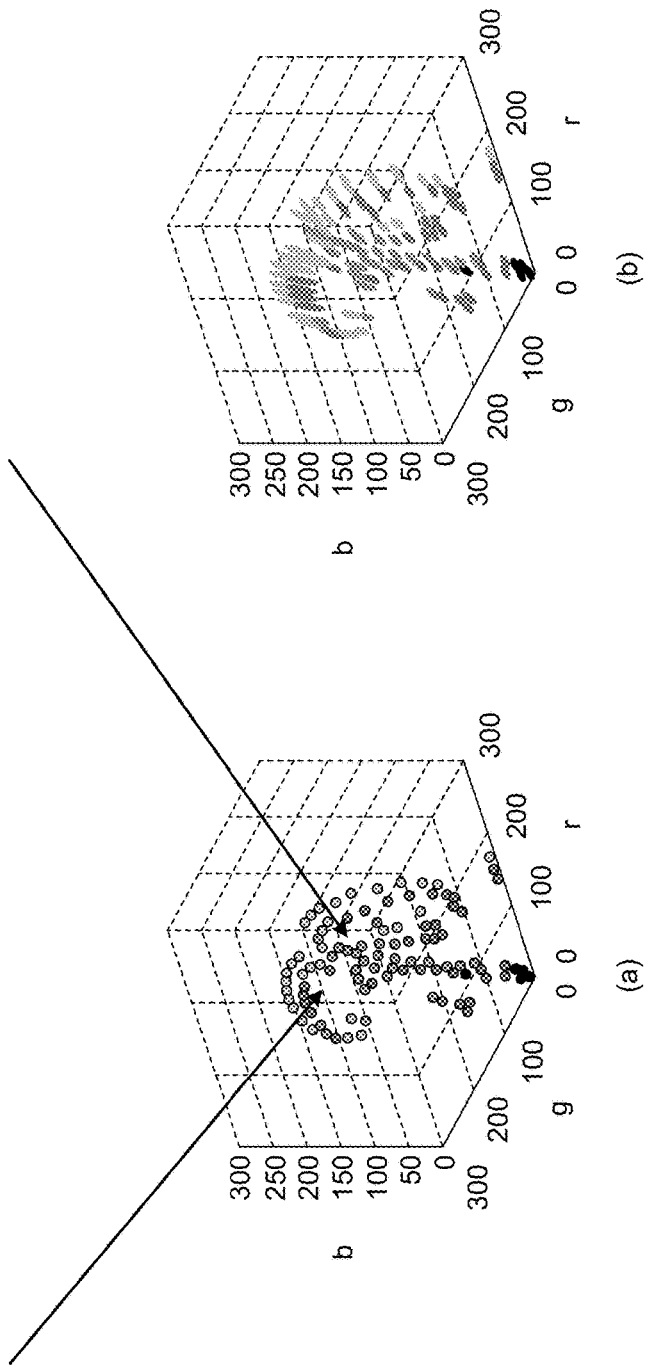
FIG. 14 is a diagram illustrating relation between initial reference RGB values and reference RGB values at calorimetry.

FIG. 13 is a diagram illustrating processing to generate the inter-reference RGB linear transformation matrix, whereas FIG. 14 is a diagram illustrating relation between the initial reference RGB values and the reference RGB values at calorimetry. The colorimetric operating unit 44, before performing the processing to transform the colorimetric object RGB values into the initialized colorimetric object RGB values (RsGsBs) (Step S10), generates the inter-reference RGB linear transformation matrix for use in the transformation. In other words, as illustrated in FIG. 13, the colorimetric operating unit 44 reads the initial reference RGB values (RdGdBd) obtained as the preprocessing when the image forming apparatus 100 is in the initial state and the reference RGB values at colorimetry (RdsGdsBds) obtained at the time of adjustment from the nonvolatile memory 45 and generates the inter-reference RGB linear transformation matrix that transforms the reference RGB values at colorimetry RdsGdsBds into the initial reference RGB values RdGdBd. The colorimetric operating unit 44 then stores the generated inter-reference RGB linear transformation matrix in the nonvolatile memory 45.

In FIG. 14, the dots depicted thinly in FIG. 14(a) are obtained by plotting the initial reference RGB values RdGdBd in an rgb space, whereas the filled dots are obtained by plotting the reference RGB values at colorimetry RdsGdsBds in the rgb space. As can be seen from FIG. 14(a), the values of the reference RGB values at colorimetry RdsGdsBds are changed from the values of the initial reference RGB values RdGdBd. Although the changing directions of these in the rgb space are substantially the same as illustrated in FIG. 14 (b), they differ in the direction of deviation depending on hue. Reasons why the RGB values change in this way even when the image of the patches of the same reference chart 400 are captured include changes with time of the colorimetric light source 30 and change with time of the two-dimensional image sensor 27.

Thus, when the colorimetric values are determined using the colorimetric object RGB values obtained by capturing the image of the patch 200 while the RGB values obtained by image capturing by the colorimetric camera 20 are changed, errors in the colorimetric values by the amount of the change can occur. In view of this, the inter-reference RGB linear transformation matrix that transforms the reference RGB values at colorimetry RdsGdsBds into the initial RGB reference values RdGdBd is determined between the initial RGB reference values RdGdBd and the reference RGB values at colorimetry RdsGdsBds using a method of estimation such as the least square method. Using the inter-reference RGB linear transformation matrix, the colorimetric object RGB values obtained by capturing the image of the patch 200 by the colorimetric camera 20 are transformed into the initialized colorimetric object RGB values RsGsBs. The basic colorimetric processing described below is performed on the transformed initialized colorimetric object RGB values RsGsBs, thereby enabling the colorimetric values of the patch 200 as a colorimetric object to be acquired with high precision.

The inter-reference RGB linear transformation matrix is not only a linear one but also a higher-order nonlinear matrix. When nonlinearity between the rgb space and the XYZ space is higher, the higher-order matrix can improve transformation accuracy.

As described above, the colorimetric operating unit 44 transforms the colorimetric object RGB values obtained by the image capturing of the patch 200 into the initialized colorimetric object RGB values (RsGsBs) using the inter-reference RGB linear transformation matrix (Step S10) and then performs the basic colorimetric processing at Step S20 on the initialized colorimetric object RGB values (RsGsBs).

Figure 15:
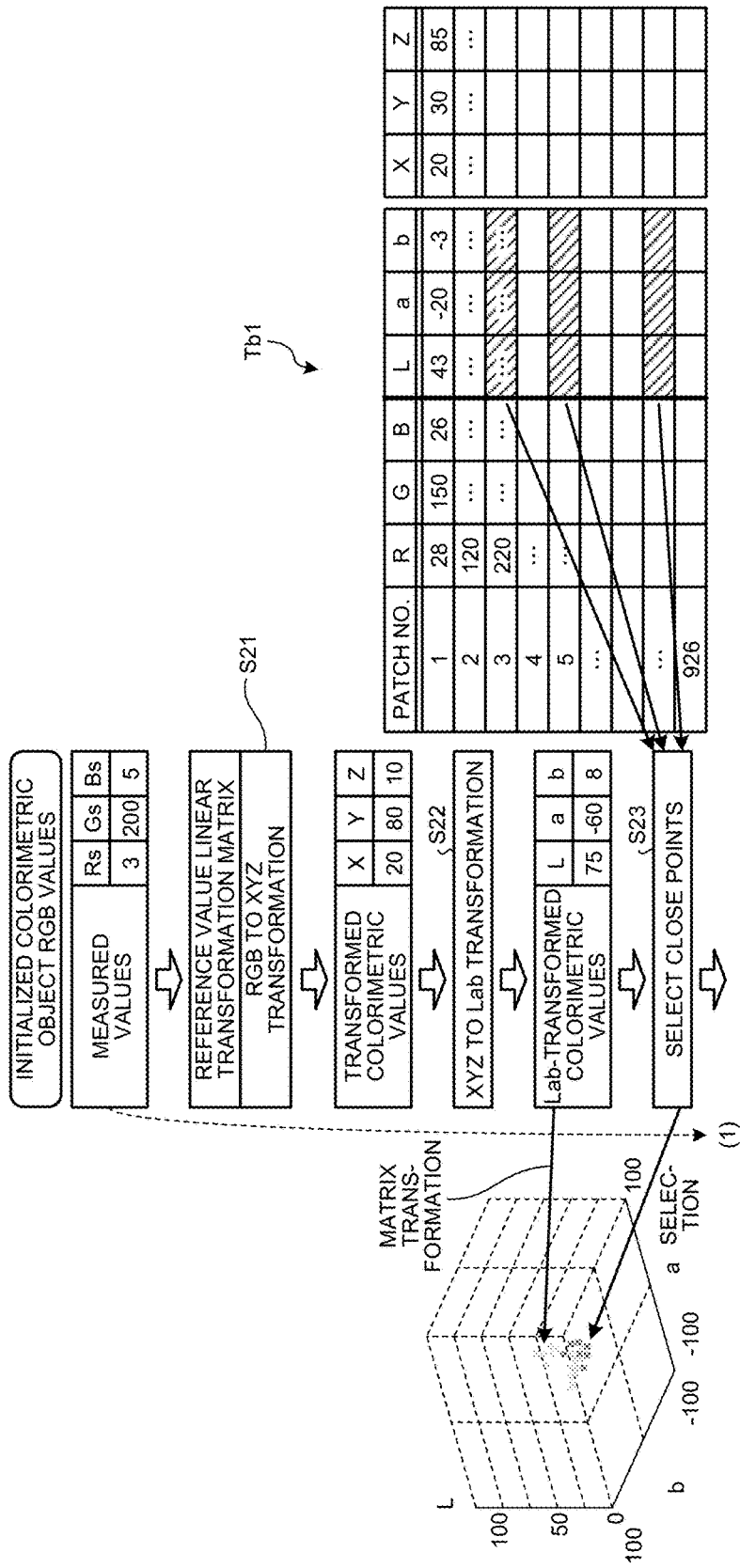
FIG. 15 is a diagram illustrating basic colorimetric processing.
Figure 16:
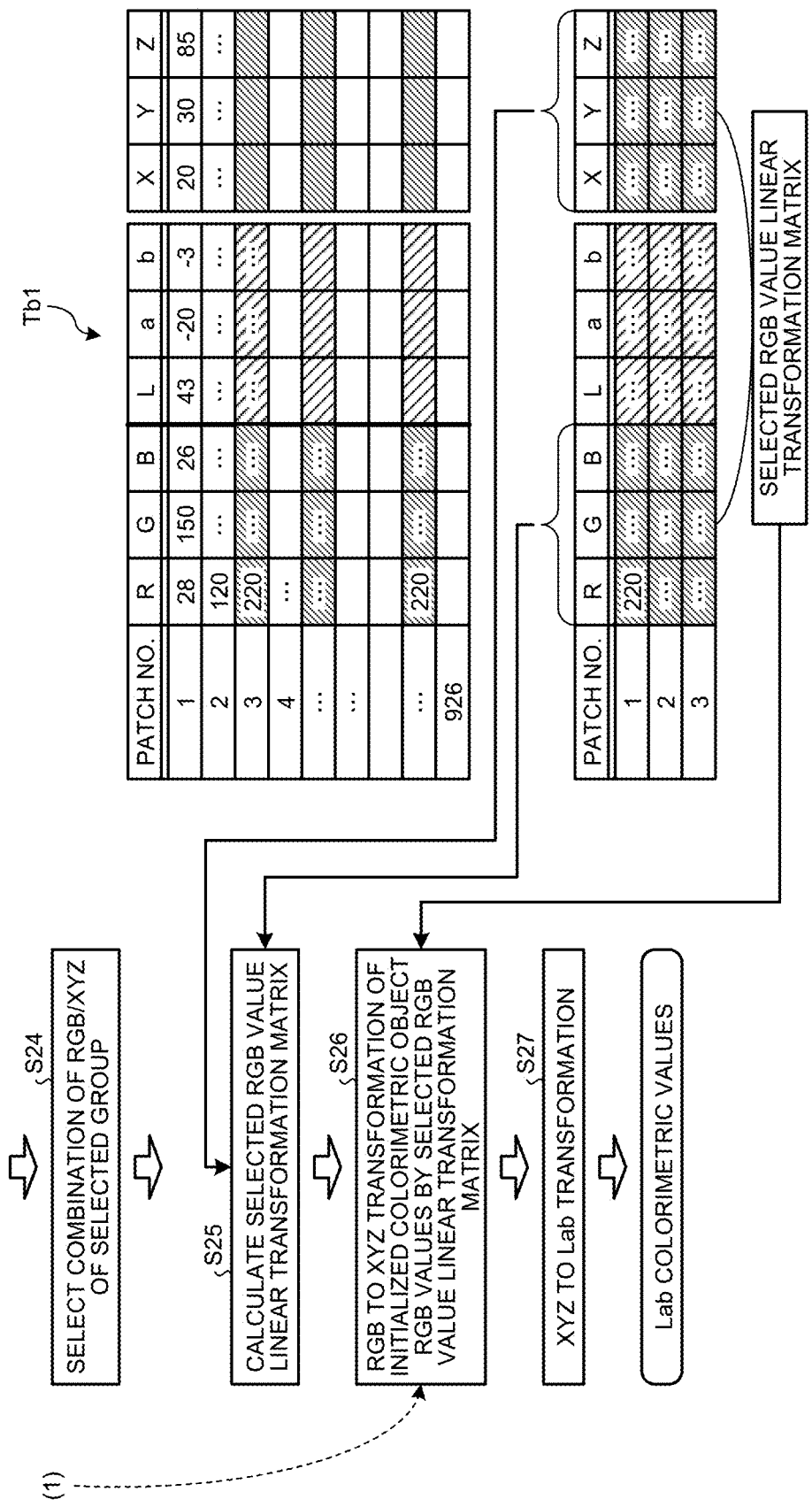
FIG. 16 is a diagram illustrating basic colorimetric processing.

FIG. 15 and FIG. 16 are diagrams illustrating the basic colorimetric processing. The colorimetric operating unit 44 first reads the reference value linear transformation matrix generated by the preprocessing and stored in the nonvolatile memory 45, transforms the initialized colorimetric object RGB values (RsGsBs) into first XYZ values using the reference value linear transformation matrix, and stores the first XYZ values in the nonvolatile memory 45 (Step S21). FIG. 19 illustrates a case in which the initialized colorimetric object RGB values (3, 200, 5) are transformed into the first XYZ values (20, 80, 10) by the reference value linear transformation matrix.

The colorimetric operating unit 44 then transforms the first XYZ values transformed from the initialized colorimetric object RGB values (RsGsBs) at Step S21 into first Lab values using a known transformation formula and stores the first Lab values in the nonvolatile memory 45 (Step S22). FIG. 15 illustrates a case in which the first XYZ values (20, 80, 10) are transformed into the first Lab values (75, −60, 8) using the known transformation formula.

The colorimetric operating unit 44 then searches for a plurality of reference colorimetric values (Lab values) stored in the memory table Tb 1 of the nonvolatile memory 45 in the preprocessing and selects a group of a plurality of patches (close color patches) having reference colorimetric values (Lab values) close to the first Lab values in the Lab space among the reference colorimetric values (Lab values) (Step S23). As a method for selecting the close patches, for example, for all the reference colorimetric values (Lab values) stored in the memory table Tb1, the distances to the first Lab values are calculated, and a plurality of patches having Lab values (the Lab values hatched in FIG. 15) close to the first Lab values may be selected.

As illustrated in FIG. 16, the colorimetric operating unit 44 then refers to the memory table Tb1, extracts the RGB values (the reference RGB values) and the XYZ values pairing up with the Lab values for each of the close color patches selected at Step S23, and selects combinations of the RGB values and the XYZ values out of these RGB values and XYZ values (Step S24). The colorimetric operating unit 44 then determines a selected RGB value linear transformation matrix for transforming the RGB values of the selected combinations (a selected group) into the XYZ values using the least square method or the like, and stores the determined selected RGB value linear transformation matrix in the nonvolatile memory 45 (Step S25).

The colorimetric operating unit 44 then transforms the initialized colorimetric object RGB values (RsGsBs) into second XYZ values using the selected RGB value linear transformation matrix generated at Step S25 (Step S26). The colorimetric operating unit 44 then transforms the second XYZ values determined at Step S26 into second Lab values using a known transformation formula (step S27) and determines the obtained second Lab values to be final colorimetric values of the patch 200 as a colorimetric object. The image forming apparatus 100 generates or modifies the device profile based on the colorimetric values obtained by the above colorimetric processing and performs color adjustment based on the device profile, thereby enabling the color reproducibility of the output image to be increased.

The above colorimetric camera 20 includes the reference chart 400 in the casing 23, thereby capturing the image of the patch 200 as a colorimetric object and the image of the reference chart 400 simultaneously by the two-dimensional image sensor 27 of the sensor unit 26. As described above, however, the initial reference RGB values and the reference RGB values at colorimetry obtained by capturing the image of the reference chart 400 are used for the colorimetric object RGB values obtained by the image capturing of the patch 200 as a colorimetric object to exclude the influence of changes with time of the image capturing conditions of the colorimetric camera 20, that is, changes with time of the colorimetric light source 30 and changes with time of the two-dimensional image sensor 27, for example. In other words, the initial reference RGB values and the reference RGB values at colorimetry obtained by capturing the image of the reference chart 400 are used for calculating the above inter-reference RGB linear transformation matrix and transforming the colorimetric object RGB values into the initialized colorimetric object RGB values (RsGsBs) using the inter-reference RGB linear transformation matrix.

Thus, if the changes of the image capturing conditions of the colorimetric camera 20 with time are in a negligible level with respect to required colorimetric accuracy, the colorimetric values of the patch 200 may be calculated using the colorimetric camera 20 with the reference chart 400 omitted. In this case, the processing to transform the colorimetric object RGB values into the initialized colorimetric object RGB values (Step S10 in FIG. 12) is omitted, and the basic colorimetric processing (Step S20 in FIG. 12, FIG. 15, and FIG. 16) is performed on the colorimetric object RGB values.

As described above in detail with reference to specific examples, the colorimetric camera 20 according to the present embodiment determines the relative positional relation of the optical path length changing member 31 and the medium type determining light source 32 with respect to the two-dimensional image sensor 27 so that the difference $\Delta\theta$ between the incident angle $\theta 1$ from the medium type determining light source 32 toward the first specular position LP1 and the incident angle $\theta 2$ from the medium type determining light source 32 toward the second specular position LP2 is the reference value $\theta$th or more, the reference value $\theta$th being determined to be a value with which the optical image Im_LP1 of the first specular position LP1 and the optical image Im_LP2 of the second specular position LP2 do not overlap each other on the light receiving face of the two-dimensional image sensor 27. Thus, the intensity of the specular light on the subject (the print medium P) is accurately determined based on the image output by the two-dimensional image sensor 27, thereby enabling the type of the print medium P to be accurately determined.

Modification of Colorimetric Camera

A modification of the colorimetric camera 20 according to the present embodiment will be described below. In the following, a modification of the colorimetric camera 20 is described as a colorimetric camera 20A, and distinguished from the above described colorimetric camera 20. In the colorimetric camera 20A according to the modification, components with the same functions as those of the above described colorimetric camera 20 are denoted by the same reference signs, and the same explanation will be omitted appropriately.

Figure 17:
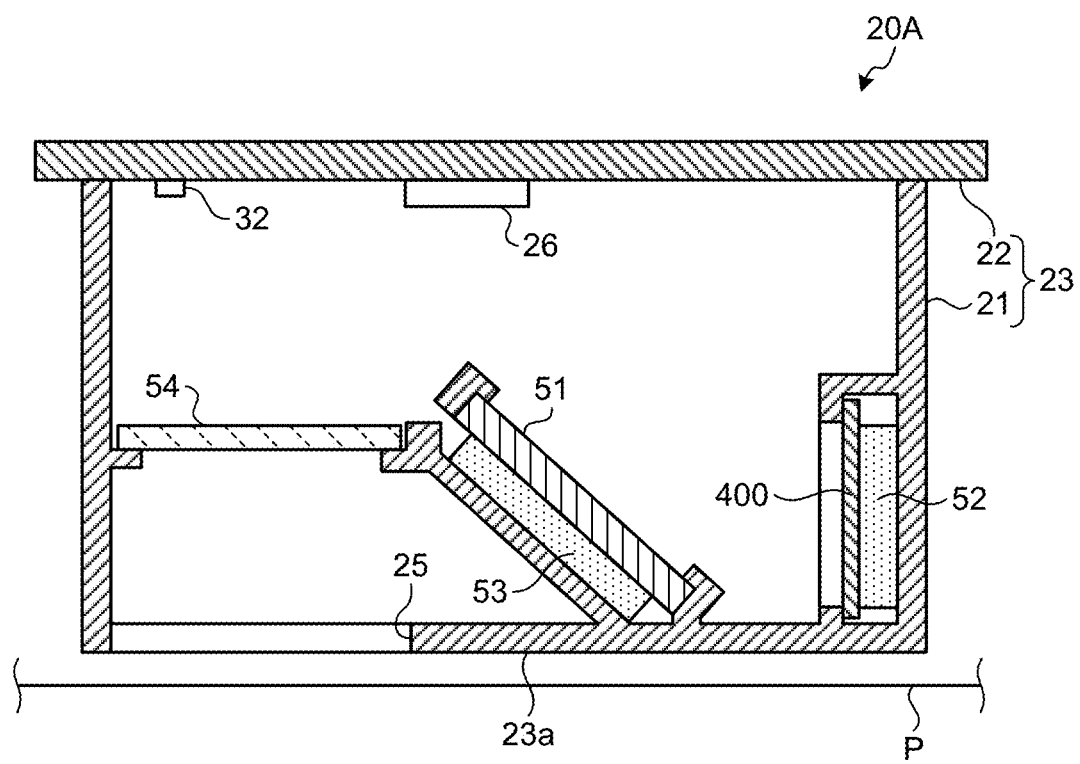
FIG. 17 is a vertical sectional view of a colorimetric camera.

FIG. 17 is a vertical sectional view of the colorimetric camera 20A according to the modification, which is a sectional view at the same position as in the vertical sectional view of the colorimetric camera 20 illustrated in FIG. 4A.

The colorimetric camera 20A according to the modification is configured such that the reference chart 400 is arranged on an inner wall of the frame body 21 that forms a side face of the casing 23 and such that the optical image of the reference chart 400 is reflected by a reflecting mirror 51 so as to enter the sensor unit 26. The reference chart 400 is pressed against a structure by, for example, a compressive resilience of a buffering member 52, and fixedly arranged so as to be parallel to the inner wall of the frame body 21. The reflecting mirror 51 is pressed against a structure by, for example, a compressive resilience of a buffering member 53, and fixedly arranged so as to be inclined by a predetermined angle with respect to the bottom face 23a of the casing 23.

In the colorimetric camera 20A according to the modification, the optical image of the reference chart 400 is reflected by the reflecting mirror 51 so as to enter the sensor unit 26, so that the optical path length from the sensor unit 26 to the reference chart 400 comes close to the optical path length from the sensor unit 26 to the patch 200 as a colorimetric object. Therefore, in the colorimetric camera 20A according to the modification, the optical path length changing member 31 of the colorimetric camera 20 as described above is not necessary. However, if the opening 25 of the casing 23 remains open, suspended matter in the air, such as ink mist or dust, that enters the inside of the casing 23 through the opening 25 may adhere to the components, such as the sensor unit 26, the colorimetric light source 30 (not illustrated in FIG. 17), the medium type determining light source 32, or the reference chart 400, resulting in adverse effects on the colorimetry of the patches 200 or the determination on the type of the print medium P. Therefore, the colorimetric camera 20A according to the modification includes a cover member 54 that prevents suspended matter in the air, such as ink mist or dust, that enters the inside of the casing 23 from adhering to the components inside the casing 23.

The cover member 54 is an optical member having a sufficient transmittance to light from the colorimetric light source 30 and the medium type determining light source 32, and is arranged in the optical path of light directed from the medium type determining light source 32 toward a subject outside the casing 23 (the margin of the print medium P). In the colorimetric camera 20A according to the modification, the relative positional relation of the cover member 54 and the medium type determining light source 32 with respect to the two-dimensional image sensor 27 is set such that the optical image of the specular light regularly reflected by the margin of the print medium P and the optical image of the specular light regularly reflected by a surface of the cover member 54 do not overlap each other on the light-receiving face of the two-dimensional image sensor 27 of the sensor unit 26 when the medium type determining light source 32 is turned on.

Specifically, when the second specular position LP2 illustrated in FIGS. 5A and 5B is defined as a specular position of the medium type determining light source 32 on the surface of the cover member 54, the relative positional relation of the cover member 54 and the medium type determining light source 32 with respect to the two-dimensional image sensor 27 is determined so that the difference $\Delta\theta$ between the incident angle $\theta1$ from the medium type determining light source 32 toward the first specular position LP1 and the incident angle $\theta2$ from the medium type determining light source 32 toward the second specular position LP2 is the reference value $\theta$th or more. The reference value $\theta$th is a value determined by simulation or the like with which the optical image Im_LP1 of the first specular position LP1 and the optical image Im_LP2 of the second specular position LP2 do not overlap each other on the light receiving face of the two-dimensional image sensor 27.

The reference value $\theta$th may be larger than the value with which the optical image Im_LP1 of the first specular position LP1 and the optical image Im_LP2 of the second specular position LP2 do not overlap each other on the light receiving face of the two-dimensional image sensor 27 and may be a value with which the optical image Im_LP2 of the second specular position LP2 is outside the light-receiving face of the two-dimensional image sensor 27. In other words, a value may be determined by simulation or the like with which the optical image Im_LP1 of the first specular position LP1 enters the light-receiving face of the two-dimensional image sensor 27 and the optical image Im_LP2 of the second specular position LP2 does not enter the two-dimensional image sensor 27, and this value may be used as the reference value $\theta$th. This case provides an advantage in that the optical image Im_LP1 of the first specular position LP1 can be simply detected from the image output by the two-dimensional image sensor 27.

As a specific method of layout for causing the difference $\Delta\theta$ between the incident angle $\theta1$ and the incident angle $\theta2$ to be the reference value $\theta$th or more, there is a method that arranges the cover member 54 at the higher position (the position close to the substrate 22) within the casing 23 to thereby increase the difference A. Instead of arranging the cover member 54 at the higher position (the position close to the substrate 22) within the casing 23, the medium type determining light source 32 may be arranged at a lower position within the casing 23, or the medium type determining light source 32 may be arranged at a position further departed from the two-dimensional image sensor 27, to thereby increase the difference $\Delta\theta$. These methods may be combined to increase the difference A. By any of these methods, the relative positional relation of the cover member 54 and the medium type determining light source 32 with respect to the two-dimensional image sensor 27 is set such that the difference $\Delta\theta$ between the incident angle $\theta1$ and the incident angle $\theta2$ is the reference value $\theta$th or more in the colorimetric camera 20A according to the modification.

Other Modifications

In the above described embodiment, the image forming apparatus 100 configured as a serial-head inkjet printer has been described by way of example; however, the present invention is not limited to the above described example and can be effectively applied to various types of image forming apparatuses. For example, when the present invention is applied to a line-head inkjet printer, a plurality of the colorimetric cameras 20 may be arranged in a direction perpendicular to a conveying direction of the print medium P. When the present invention is applied to an electrophotography image forming apparatus, a plurality of the colorimetric cameras 20 may be arranged in the direction perpendicular to the conveying direction of the print medium P in at least a certain position on the conveying path of the print medium P having been subjected to image fixation. In particular, when colorimetry of each of the patches 200 contained in the test pattern (acquisition of the RGB values) is performed by using a plurality of the colorimetric cameras 20 while conveying the print medium P, it is preferable to form each of the patches 200 contained in the test pattern in a shape elongated in the conveying direction of the print medium P.

In the above described embodiment, the colorimetric camera 20 has the function to calculate the colorimetric values of the patches 200; however, the colorimetric values of the patches 200 may be calculated outside the colorimetric camera 20. For example, the CPU 101 or the control FPGA 110 mounted on the main control board 120 of the image forming apparatus 100 may calculate the colorimetric values of the patches 200. In this case, the colorimetric camera 20 is configured to send the RGB values of the patches 200 or the reference patches contained in the reference chart 400 to the CPU 101 or the control FPGA 110, instead of the colorimetric values of the patches 200. In other words, the colorimetric camera 20 is configured as an image capturing apparatus that does not have the function to calculate the colorimetric values.

The control functions of the components of the image forming apparatus 100 and the colorimetric camera 20 (medium type determining apparatus) according to the present embodiment as described above may be implemented by hardware, software, or a mixture of hardware and software. When the control functions of the components of the image forming apparatus 100 and the colorimetric camera 20 (medium type determining apparatus) according to the present embodiment are implemented by software, processors included in the image forming apparatus 100 and the colorimetric camera 20 (medium type determining apparatus) execute computer programs in which processing sequences are written. For example, the computer programs executed by the processors may be provided by being incorporated in ROMs or the like inside the image forming apparatus 100 and the colorimetric camera 20 (medium type determining apparatus) in advance. The computer programs executed by the processors may be provided by being recorded in a computer-readable recording medium, such as a CD-ROM, a flexible disk (FD), CD-R, or a digital versatile disc (DVD), in a computer-installable or computer-executable file format.

The computer programs executed by the processors may be stored in a computer connected to a network, such as the Internet, and may be provided by being downloaded via the network. The computer programs executed by the processors may be provided or distributed via a network, such as the Internet.

An aspect of the present invention provides the effect that specular light from a subject can be accurately detected.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An image capturing apparatus, comprising:
   a light source;
   a two-dimensional image sensor that receives reflected light from a subject including specular light of the light source and outputs an image of the subject; and
   an optical member arranged in an optical path of light emitted from the light source to the subject, wherein
   when a specular position of the light source in the subject arranged apart from the two-dimensional image sensor by a certain distance is defined as a first specular position, whereas a specular position of the light source in the optical member is defined as a second specular position, a relative positional relation of the optical member and the light source with respect to the two-dimensional image sensor is determined so that a difference between an incident angle from the light source toward the first specular position and an incident angle from the light source toward the second specular position is a reference value, and
   the reference value is a value with which an optical image of the first specular position and an optical image of the second specular position do not overlap each other on a light-receiving face of the two-dimensional image sensor.

2. The image capturing apparatus according to claim 1, wherein the reference value is a value with which the optical image of the first specular position enters the light-receiving face of the two-dimensional image sensor and the optical image of the second specular position does not enter the light-receiving face of the two-dimensional image sensor.

3. The image capturing apparatus according to claim 1, wherein
   the optical member is an optical path length changing member that changes an optical path length between the subject and the two-dimensional image sensor.

4. The image capturing apparatus according to claim 1, further comprising:
   a casing that houses the light source, the two-dimensional image sensor, and the optical member, and that includes an opening, wherein
   the optical member is a cover member that prevents suspended matter in the air, which enters inside of the casing from outside of the casing through the opening, from adhering to the light source or the two-dimensional image sensor.

5. A medium type determining apparatus, comprising:
   the image capturing apparatus according to claim 1; and
   a determining unit that, based on an image of an print medium output by the two-dimensional image sensor when the printed medium on which an image is printed is used as the subject, determines a type of the print medium.

6. An image forming apparatus comprising the medium type determining apparatus according to claim 5.

* * * * *